(12) United States Patent
Miura et al.

(10) Patent No.: US 12,489,086 B2
(45) Date of Patent: Dec. 2, 2025

(54) SEMICONDUCTOR DEVICE

(71) Applicant: Kioxia Corporation, Tokyo (JP)

(72) Inventors: Masayuki Miura, Ota Tokyo (JP);
Kazuma Hasegawa, Kamakura Kanagawa (JP); Kazushige Kawasaki, Kawasaki Kanagawa (JP)

(73) Assignee: KIOXIA Corporation, Tokyo (JP)

( * ) Notice: Subject to any disclaimer, the term of this patent is extended or adjusted under 35 U.S.C. 154(b) by 526 days.

(21) Appl. No.: 17/934,135

(22) Filed: Sep. 21, 2022

(65) Prior Publication Data
US 2023/0207520 A1 Jun. 29, 2023

(30) Foreign Application Priority Data
Dec. 27, 2021 (JP) .................................. 2021-212460

(51) Int. Cl.
*H01L 25/065* (2023.01)
*H01L 23/00* (2006.01)
*H01L 21/56* (2006.01)

(52) U.S. Cl.
CPC .......... *H01L 25/0652* (2013.01); *H01L 24/32* (2013.01); *H01L 24/48* (2013.01); *H01L 24/73* (2013.01); *H01L 21/563* (2013.01); *H01L 24/16* (2013.01); *H01L 2224/16225* (2013.01); *H01L 2224/32145* (2013.01); *H01L 2224/32225* (2013.01); *H01L 2224/48091* (2013.01); *H01L 2224/48149* (2013.01); *H01L 2224/48225* (2013.01); *H01L 2224/73204* (2013.01); *H01L 2224/73215* (2013.01); *H01L 2224/73265* (2013.01); *H01L 2924/1431* (2013.01); *H01L 2924/1438* (2013.01); *H01L 2924/182* (2013.01)

(58) Field of Classification Search
CPC ...... H01L 25/0652; H01L 24/32; H01L 24/48
See application file for complete search history.

(56) References Cited

U.S. PATENT DOCUMENTS

| | | | |
|---|---|---|---|
| 6,982,485 B1 | 1/2006 | Lee et al. | |
| 7,763,964 B2 | 7/2010 | Matsushima | |
| 9,640,513 B2 | 5/2017 | Lee et al. | |
| 9,917,072 B2 | 3/2018 | Yu et al. | |
| 2012/0153471 A1 | 6/2012 | Watanabe et al. | |
| 2016/0365340 A1 | 12/2016 | Tajima et al. | |
| 2017/0084576 A1* | 3/2017 | Yu | H01L 25/18 |
| 2017/0271231 A1 | 9/2017 | Iwamoto | |

(Continued)

FOREIGN PATENT DOCUMENTS

| | | |
|---|---|---|
| JP | 2012-129452 A | 7/2012 |
| JP | 2017-5187 A | 1/2017 |

(Continued)

*Primary Examiner* — Errol V Fernandes
(74) *Attorney, Agent, or Firm* — Finnegan, Henderson, Farabow, Garrett & Dunner, LLP

(57) ABSTRACT

A semiconductor device includes a wiring substrate inside which a wiring layer is provided, a plurality of first semiconductor chips stacked in a shifted manner on the wiring substrate and each provided with a connection terminal on a surface facing the wiring substrate, and a second semiconductor chip having a function different from functions of the first semiconductor chips and provided on the wiring substrate on a side where the connection terminals are electrically connected to the wiring substrate.

11 Claims, 19 Drawing Sheets

(56) References Cited

U.S. PATENT DOCUMENTS

| | | | |
|---|---|---|---|
| 2018/0122771 A1* | 5/2018 | Park | H01L 23/49 |
| 2020/0075543 A1 | 3/2020 | Kosaka | |
| 2020/0212005 A1 | 7/2020 | Fang et al. | |
| 2020/0303345 A1* | 9/2020 | Goto | H01L 23/5386 |
| 2023/0083522 A1 | 3/2023 | Ide et al. | |
| 2023/0089223 A1 | 3/2023 | Homma et al. | |

FOREIGN PATENT DOCUMENTS

| | | |
|---|---|---|
| JP | 2020-35957 A | 3/2020 |
| JP | 2023-42073 A | 3/2023 |
| JP | 2023-45852 A | 4/2023 |
| TW | 201623532 A | 7/2016 |
| TW | 201810552 A | 3/2018 |

\* cited by examiner

SEMICONDUCTOR DEVICE

CROSS-REFERENCE TO RELATED APPLICATION

This application is based upon and claims the benefit of priority from Japanese Patent Application No. 2021-212460, filed on Dec. 27, 2021, the entire contents of which are incorporated herein by reference.

BACKGROUND OF THE INVENTION

Field of the Invention

The present embodiments relate to a semiconductor device.

Description of the Related Art

In a configuration of a semiconductor device, a plurality of chips are stacked and terminals extend in the stacking direction from the chips. In the semiconductor device, it is desired to appropriately dispose other chips in addition to the plurality of chips.

DETAILED DESCRIPTION OF THE PREFERRED EMBODIMENTS

Figure 1:
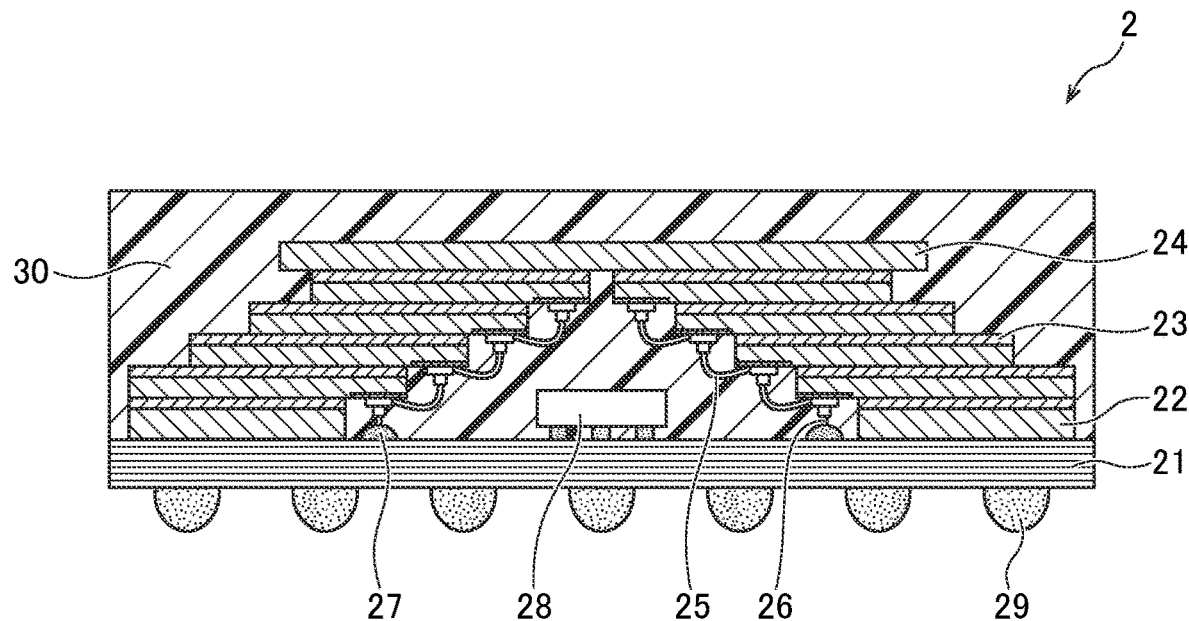
FIG. 1 is a cross-sectional view illustrating a semiconductor device in a first embodiment.

The present embodiments will be described below with reference to the accompanying drawings. To facilitate understanding of the description, identical constituent components in the drawings are denoted by the same reference sign when possible, and duplicate description thereof is omitted.

A semiconductor device 2 in a first embodiment will be described below with reference to FIG. 1. FIG. 1 is a cross-sectional view of the semiconductor device 2. As illustrated in FIG. 1, the semiconductor device 2 includes a wiring substrate 21, a spacer 22, a first semiconductor chip 23, a support body 24, a loop wire 25, a vertical wire 26, a metal bump 27, a second semiconductor chip 28, a metal ball 29, and a molding resin layer 30. The metal bump 27 has a shape protruding upward from the wiring substrate 21 toward the first semiconductor chip 23. The metal bump 27 is provided inside the molding resin layer 30. The molding resin layer 30 corresponds to a "first resin" of the present embodiment.

The wiring substrate 21 is a substrate inside which a non-illustrated wiring layer is provided. The first semiconductor chip 23 is provided on the wiring substrate 21. The first semiconductor chip 23 is, for example, a memory chip of a NAND flash memory. A plurality of the first semiconductor chips 23 are stacked. In the example illustrated in FIG. 1, eight first semiconductor chips 23 are divided into two sets and four first semiconductor chips 23 are stacked in each set, but the total number of first semiconductor chips 23, the number of sets, and the number of stacked first semiconductor chips 23 are not limited thereto. The first semiconductor chips 23 are stacked in a shifted manner such that part of each first semiconductor chip 23 faces the wiring substrate 21.

The second semiconductor chip 28 is flip-chip mounted on the wiring substrate 21. The second semiconductor chip 28 is, for example, a semiconductor chip on which an any LSI is mounted and has a function different from those of the first semiconductor chips 23. The second semiconductor chip 28 is mounted on the wiring substrate 21 through a metal bump. A surface of the wiring substrate 21 on which the second semiconductor chip 28 is mounted is a surface on a side where a connection terminal of each first semiconductor chip 23 is electrically connected to the wiring substrate 21.

The first semiconductor chips 23 divided in two sets and mounted are disposed in a shifted manner such that the first semiconductor chips 23 in each set are sequentially positioned closer to the second semiconductor chip 28. The first semiconductor chip 23 disposed closest to the wiring substrate 21 is disposed farthest from the second semiconductor chip 28. The other first semiconductor chips 23 are disposed on the first semiconductor chip 23 disposed closest to the wiring substrate 21, in a shifted manner such that the first semiconductor chips 23 are sequentially positioned closer to the second semiconductor chip 28. The first semiconductor chip 23 disposed farthest from the wiring substrate 21 is disposed closest to the second semiconductor chip 28. In this manner, the first semiconductor chips 23 thus stacked are shifted from each other such that the first semiconductor chips 23 positioned farther from the wiring substrate 21 in the stacking direction (direction orthogonal to the surface of the wiring substrate 21) are positioned closer to the second semiconductor chip 28 in the direction orthogonal to the stacking direction (direction parallel to the surface of the wiring substrate 21).

A die attach film (DAF) is provided between the stacked first semiconductor chips 23. The stacked first semiconductor chips 23 are electrically connected to each other through the loop wire 25. The metal bump 27 is provided on the wiring substrate 21. The first semiconductor chip 23 disposed closest to the wiring substrate 21 is electrically connected to the metal bump 27 through the vertical wire 26. The vertical wire 26 is connected to the connection terminal included in the first semiconductor chip 23.

The spacer 22 is provided between the first semiconductor chip 23 disposed closest to the wiring substrate 21 and the wiring substrate 21. A die attach film (DAF) is provided between the spacer 22 and the first semiconductor chip 23. Although not illustrated, a bonding layer is provided between the wiring substrate 21 and the spacer 22.

The support body 24 is provided on the first semiconductor chip 23 disposed farthest from the wiring substrate 21. A die attach film (DAF) is provided between the support body 24 and the first semiconductor chip 23.

The molding resin layer 30 is provided on the wiring substrate 21. The molding resin layer 30 covers the spacer 22, the first semiconductor chips 23, the support body 24, the loop wire 25, the vertical wire 26, and the metal bump 27.

The metal ball 29 is provided on a surface on a side opposite a surface of the wiring substrate 21 on which the first semiconductor chips 23 are mounted.

Figure 2:
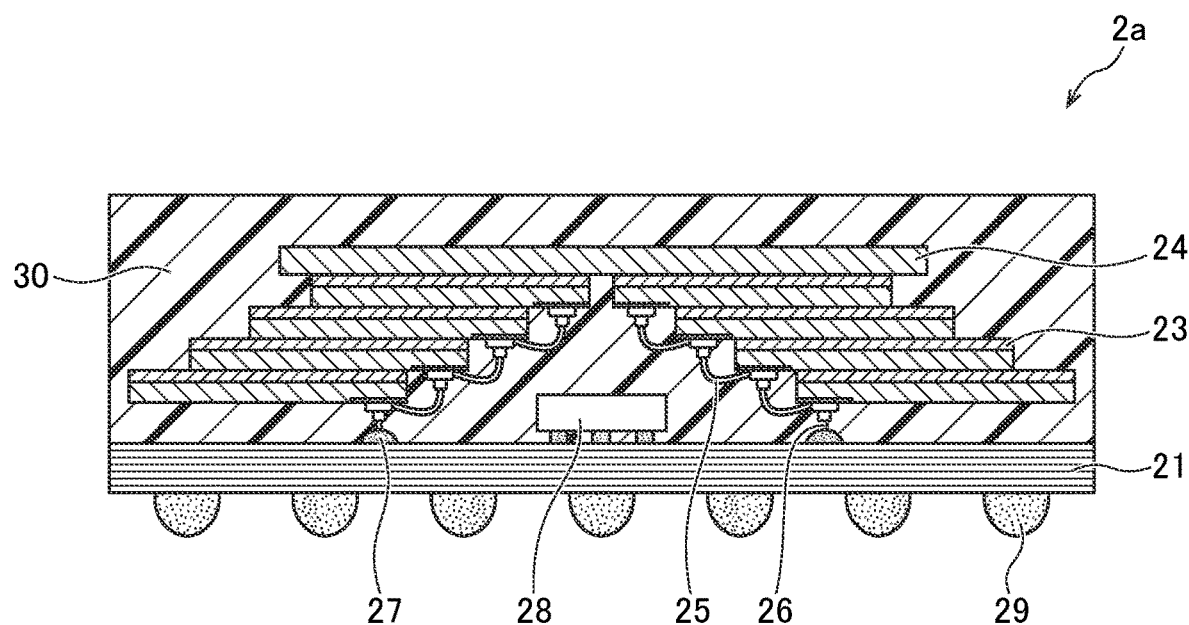
FIG. 2 is a cross-sectional view illustrating a first modification of the semiconductor device in the first embodiment.
Figure 3:
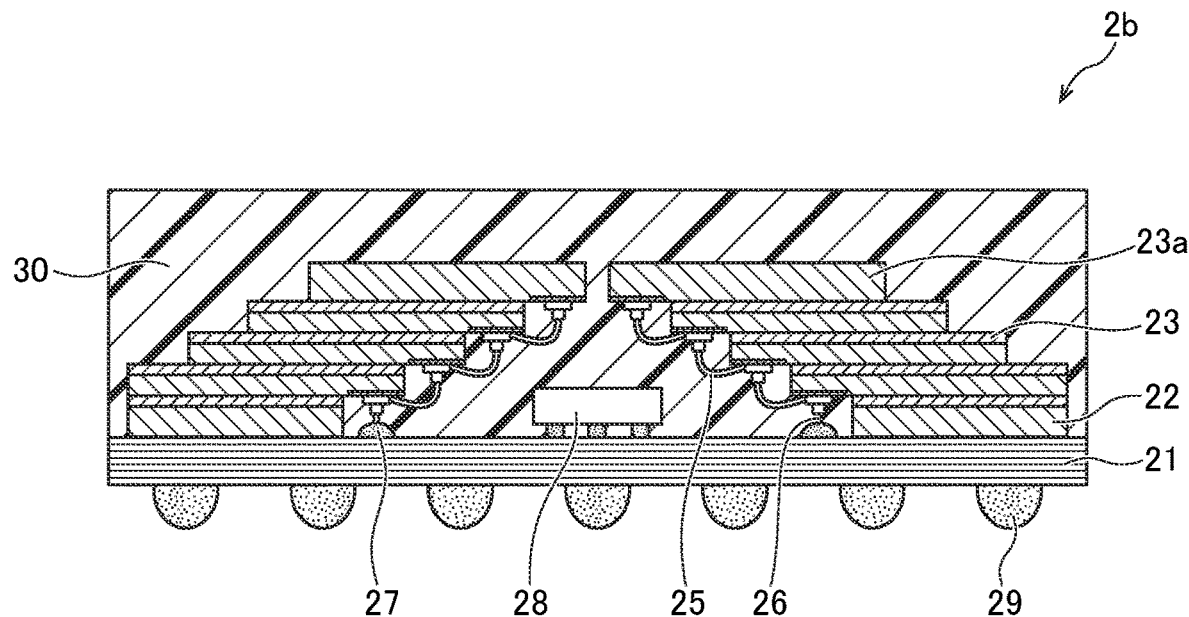
FIG. 3 is a cross-sectional view illustrating a second modification of the semiconductor device in the first embodiment.
Figure 4:
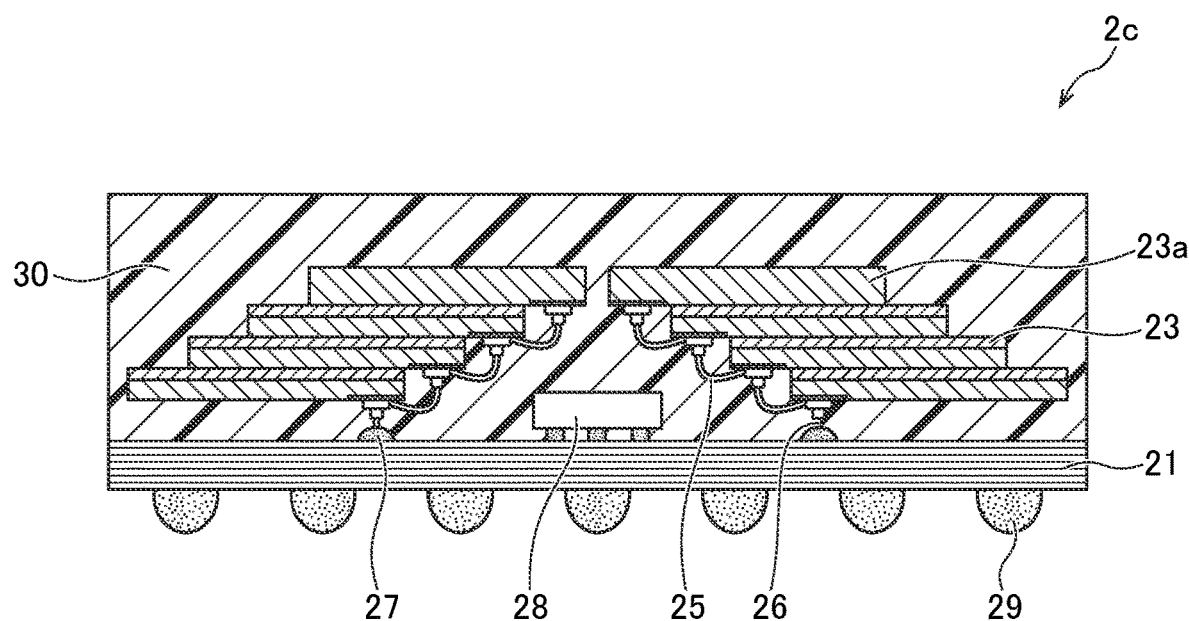
FIG. 4 is a cross-sectional view illustrating a third modification of the semiconductor device in the first embodiment.

The spacer 22 included in the semiconductor device 2 described above with reference to FIG. 1 is an optional constituent component. No spacer 22 may be provided as in a semiconductor device 2a illustrated in FIG. 2. The support body 24 included in the semiconductor device 2 described above with reference to FIG. 1 is an optional constituent component. No support body 24 may be provided as in a semiconductor device 2b illustrated in FIG. 3. When no support body 24 is provided, a first semiconductor chip 23a disposed farthest from the wiring substrate 21 is formed thicker than the other first semiconductor chips 23. No spacer 22 nor support body 24 may be provided as in a semiconductor device 2c illustrated in FIG. 4. In this case as well, the first semiconductor chip 23a disposed farthest from the wiring substrate 21 is formed thicker than the other first semiconductor chips 23.

Figure 5:
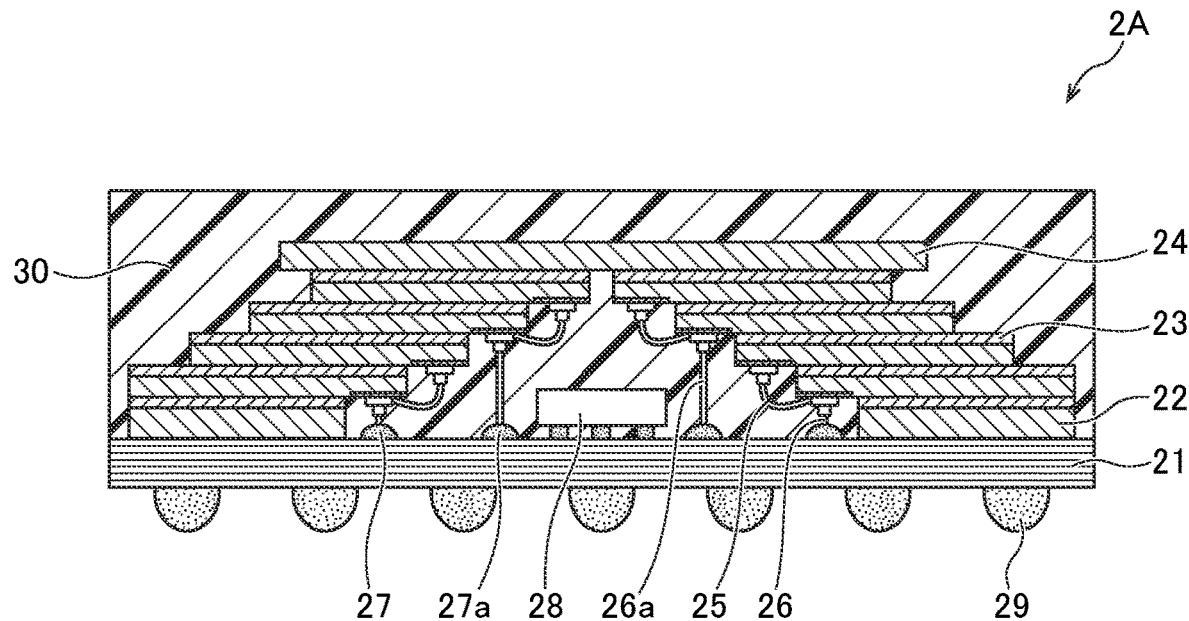
FIG. 5 is a cross-sectional view illustrating a semiconductor device in a second embodiment.

A semiconductor device 2A in a second embodiment will be described below with reference to FIG. 5. FIG. 5 is a cross-sectional view of the semiconductor device 2A. As illustrated in FIG. 5, the semiconductor device 2A includes a wiring substrate 21, a spacer 22, a first semiconductor chip 23, a support body 24, a loop wire 25, vertical wires 26 and 26a, metal bumps 27 and 27a, a second semiconductor chip 28, a metal ball 29, and a molding resin layer 30.

The first semiconductor chip 23 is provided on the wiring substrate 21. The first semiconductor chip 23 is, for example, a memory chip of a NAND flash memory. A plurality of the first semiconductor chips 23 are stacked. In the example illustrated in FIG. 5, eight first semiconductor chips 23 are divided into two sets and four first semiconductor chips 23 are stacked in each set, but the total number of first semiconductor chips 23, the number of sets, and the number of stacked first semiconductor chips 23 are not limited thereto. The first semiconductor chips 23 are stacked in a shifted manner such that part of each first semiconductor chip 23 faces the wiring substrate 21.

The second semiconductor chip 28 is flip-chip mounted on the wiring substrate 21. The second semiconductor chip 28 is, for example, a semiconductor chip on which an any LSI is mounted. The second semiconductor chip 28 is mounted on the wiring substrate 21 through a metal bump.

The first semiconductor chips 23 divided in two sets and mounted are disposed in a shifted manner such that the first semiconductor chips 23 in each set are sequentially positioned closer to the second semiconductor chip 28. The first semiconductor chip 23 disposed closest to the wiring substrate 21 is disposed farthest from the second semiconductor chip 28. The other first semiconductor chips 23 are disposed on the first semiconductor chip 23 disposed closest to the wiring substrate 21, in a shifted manner such that the first semiconductor chips 23 are sequentially positioned closer to the second semiconductor chip 28. The first semiconductor chip 23 disposed farthest from the wiring substrate 21 is disposed closest to the second semiconductor chip 28.

A die attach film (DAF) is provided between the stacked first semiconductor chips 23. The stacked first semiconductor chips 23 are divided into a plurality of sets and electrically connected to each other through the loop wire 25. In the case of FIG. 5, two first semiconductor chips 23 stacked in each set are connected to each other through the loop wire 25. The metal bumps 27 and 27a are provided on the wiring substrate 21. The first semiconductor chip 23 disposed closest to the wiring substrate 21 is electrically connected to the metal bump 27 through the vertical wire 26. The first semiconductor chip 23 stacked third closest to the wiring substrate 21 is electrically connected to the metal bump 27a through the vertical wire 26a.

The spacer 22 is provided between the first semiconductor chip 23 disposed closest to the wiring substrate 21 and the wiring substrate 21. A die attach film (DAF) is provided between the spacer 22 and the first semiconductor chip 23. Although not illustrated, a bonding layer is provided between the wiring substrate 21 and the spacer 22.

The support body 24 is provided on the first semiconductor chip 23 disposed farthest from the wiring substrate 21. A die attach film (DAF) is provided between the support body 24 and the first semiconductor chip 23.

The molding resin layer 30 is provided on the wiring substrate 21. The molding resin layer 30 covers the spacer 22, the first semiconductor chips 23, the support body 24, the loop wire 25, the vertical wires 26 and 26a, and the metal bumps 27 and 27a.

The metal ball 29 is provided on a surface on a side opposite a surface of the wiring substrate 21 on which the first semiconductor chips 23 are mounted.

Figure 6:
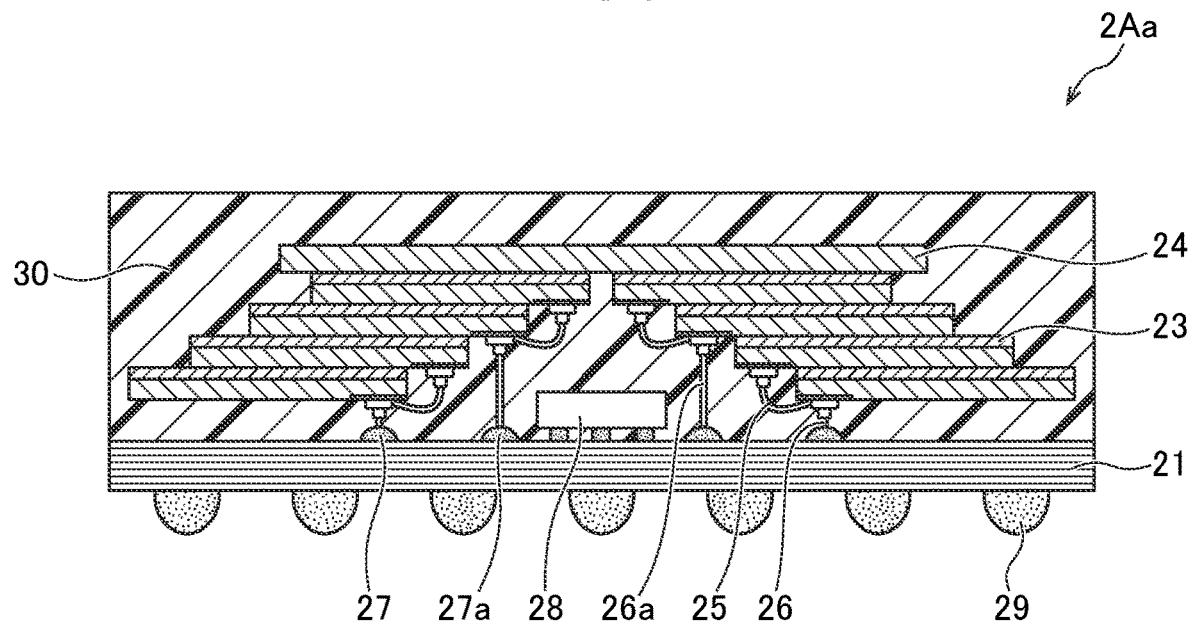
FIG. 6 is a cross-sectional view illustrating a first modification of the semiconductor device in the second embodiment.
Figure 7:
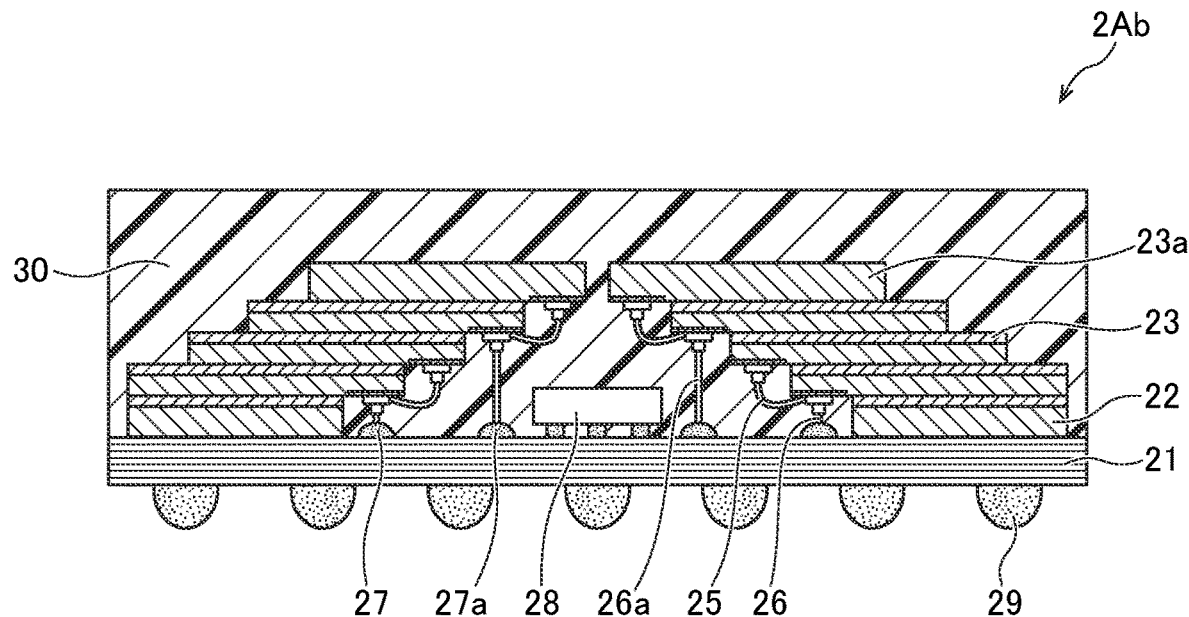
FIG. 7 is a cross-sectional view illustrating a second modification of the semiconductor device in the second embodiment.
Figure 8:
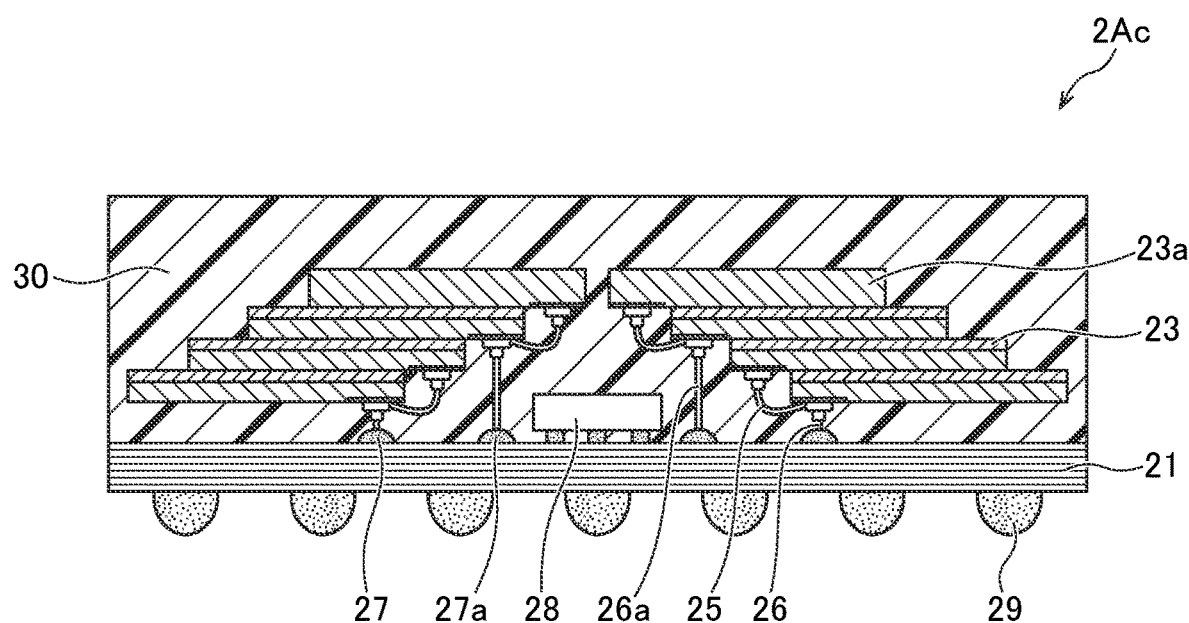
FIG. 8 is a cross-sectional view illustrating a third modification of the semiconductor device in the second embodiment.

The spacer 22 included in the semiconductor device 2A described above with reference to FIG. 5 is an optional constituent component. No spacer 22 may be provided as in the semiconductor device 2A illustrated in FIG. 6a. The support body 24 included in the semiconductor device 2A described above with reference to FIG. 5 is an optional constituent component. No support body 24 may be provided as in the semiconductor device 2A illustrated in FIG. 7b. When no support body 24 is provided, a first semiconductor chip 23a disposed farthest from the wiring substrate 21 is formed thicker than the other first semiconductor chips 23. No spacer 22 nor support body 24 may be provided as in a semiconductor device 2Ac illustrated in FIG. 8. In this case as well, the first semiconductor chip 23a disposed farthest from the wiring substrate 21 is formed thicker than the other first semiconductor chips 23.

Figure 9:
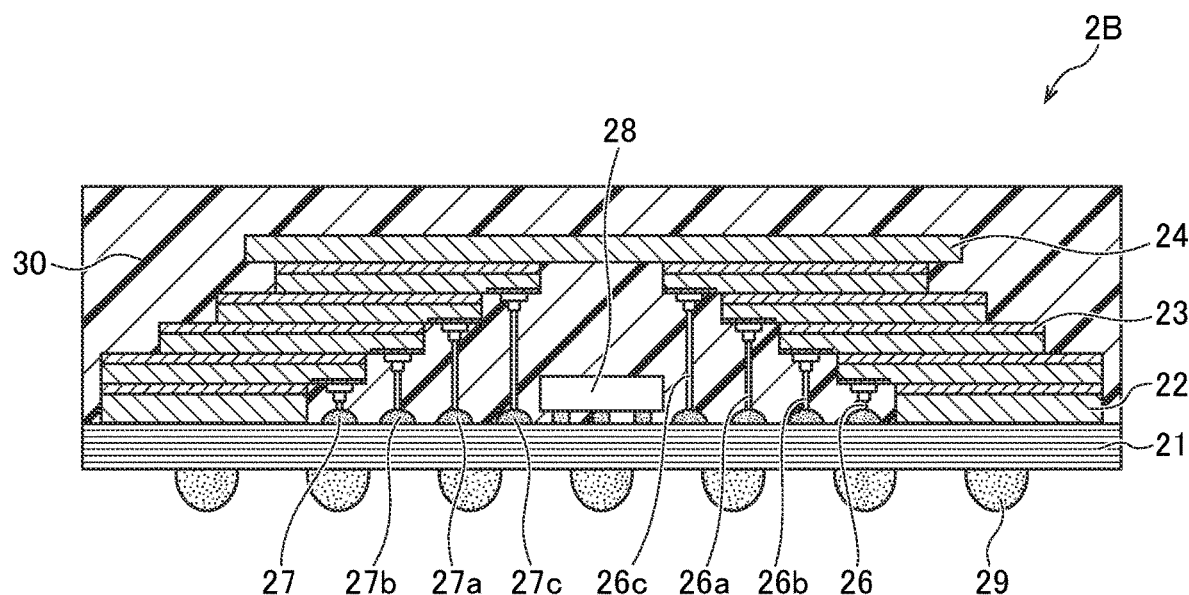
FIG. 9 is a cross-sectional view illustrating a semiconductor device in a third embodiment.

A semiconductor device 2B in a third embodiment will be described below with reference to FIG. 9. FIG. 9 is a cross-sectional view of the semiconductor device 2B. As illustrated in FIG. 9, the semiconductor device 2B includes a wiring substrate 21, a spacer 22, a first semiconductor chip 23, a support body 24, vertical wires 26, 26a, 26b, and 26c, metal bumps 27, 27a, 27b, and 27c, a second semiconductor chip 28, a metal ball 29, and a molding resin layer 30.

The first semiconductor chip 23 is provided on the wiring substrate 21. The first semiconductor chip 23 is, for example, a memory chip of a NAND flash memory. A plurality of the first semiconductor chips 23 are stacked. In the example illustrated in FIG. 9, eight first semiconductor chips 23 are divided into two sets and four first semiconductor chips 23 are stacked in each set, but the total number of first semiconductor chips 23, the number of sets, and the number of stacked first semiconductor chips 23 are not limited thereto. The first semiconductor chips 23 are stacked in a shifted manner such that part of each first semiconductor chip 23 faces the wiring substrate 21.

The second semiconductor chip 28 is flip-chip mounted on the wiring substrate 21. The second semiconductor chip 28 is, for example, a semiconductor chip on which an any LSI is mounted. The second semiconductor chip 28 is mounted on the wiring substrate 21 through a metal bump.

The first semiconductor chips 23 divided in two sets and mounted are disposed in a shifted manner such that the first semiconductor chips 23 in each set are sequentially positioned closer to the second semiconductor chip 28. The first semiconductor chip 23 disposed closest to the wiring substrate 21 is disposed farthest from the second semiconductor chip 28. The other first semiconductor chips 23 are disposed on the first semiconductor chip 23 disposed closest to the wiring substrate 21, in a shifted manner such that the first semiconductor chips 23 are sequentially positioned closer to the second semiconductor chip 28. The first semiconductor chip 23 disposed farthest from the wiring substrate 21 is disposed closest to the second semiconductor chip 28.

A die attach film (DAF) is provided between the stacked first semiconductor chips 23. The metal bumps 27, 27a, 27b, and 27c are provided on the wiring substrate 21. The first semiconductor chip 23 disposed closest to the wiring substrate 21 is electrically connected to the metal bump 27 through the vertical wire 26. The first semiconductor chip 23 stacked second closest to the wiring substrate 21 is electrically connected to the metal bump 27b through the vertical wire 26b. The first semiconductor chip 23 stacked third closest to the wiring substrate 21 is electrically connected to the metal bump 27a through the vertical wire 26a. The first semiconductor chip 23 stacked fourth closest to the wiring substrate 21 is electrically connected to the metal bump 27c through the vertical wire 26c.

The spacer 22 is provided between the first semiconductor chip 23 disposed closest to the wiring substrate 21 and the wiring substrate 21. A die attach film (DAF) is provided between the spacer 22 and the first semiconductor chip 23. Although not illustrated, a bonding layer is provided between the wiring substrate 21 and the spacer 22.

The support body 24 is provided on the first semiconductor chip 23 disposed farthest from the wiring substrate 21. A die attach film (DAF) is provided between the support body 24 and the first semiconductor chip 23.

The molding resin layer 30 is provided on the wiring substrate 21. The molding resin layer 30 covers the spacer 22, the first semiconductor chips 23, the support body 24, the vertical wires 26, 26a, 26b, and 26c, and the metal bumps 27, 27a, 27b, and 27c.

The metal ball 29 is provided on a surface on a side opposite a surface of the wiring substrate 21 on which the first semiconductor chips 23 are mounted.

Figure 10:
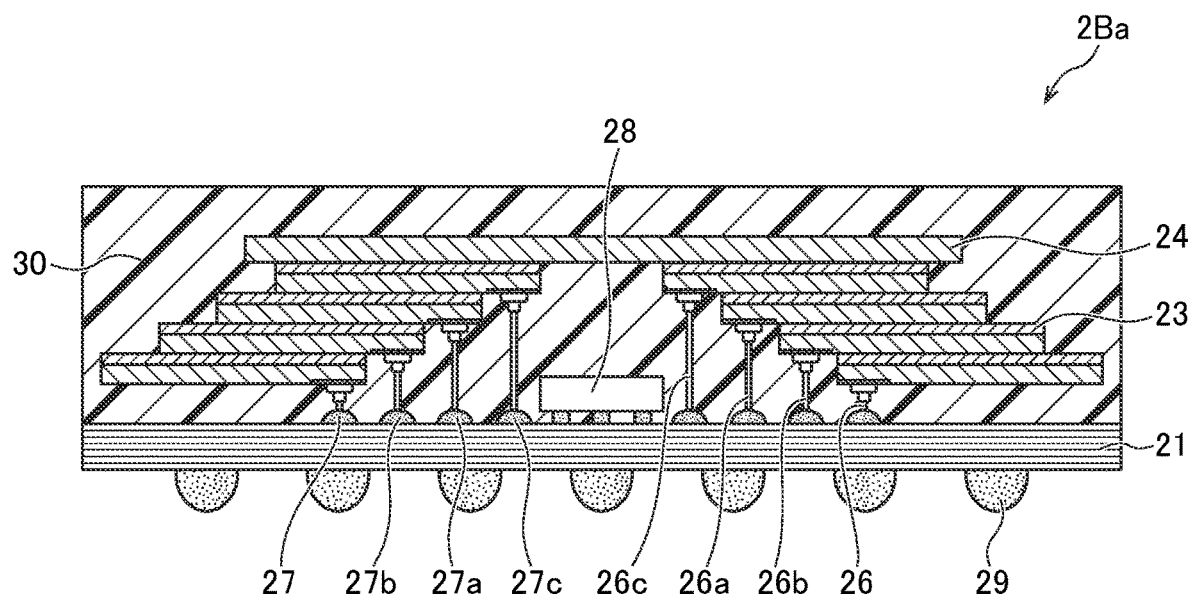
FIG. 10 is a cross-sectional view illustrating a first modification of the semiconductor device in the third embodiment.
Figure 11:
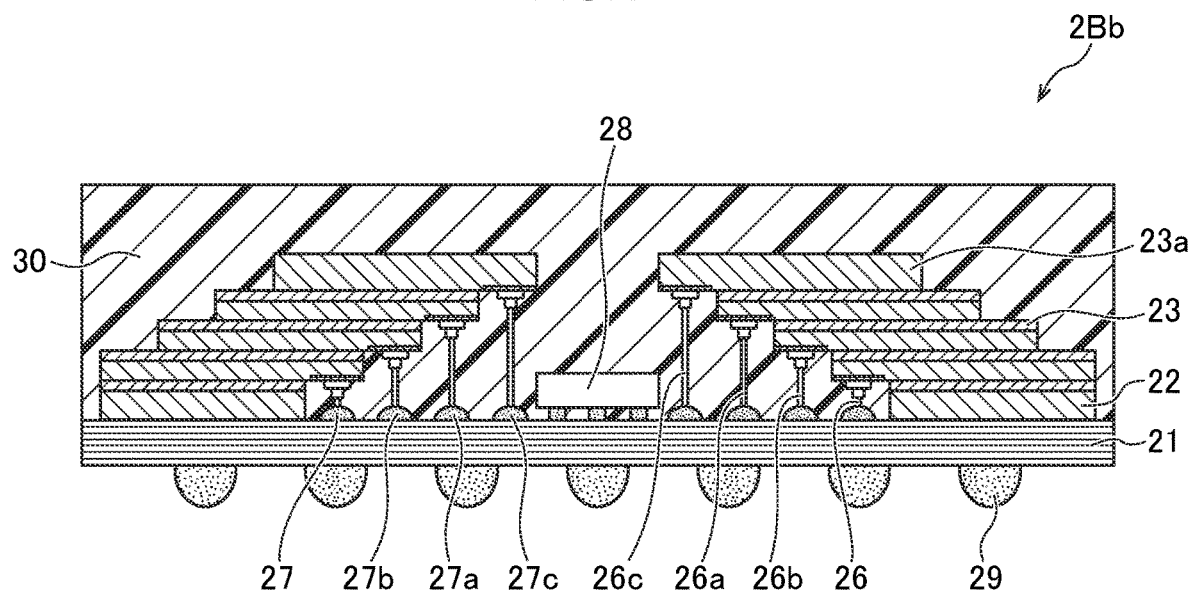
FIG. 11 is a cross-sectional view illustrating a second modification of the semiconductor device in the third embodiment.
Figure 12:
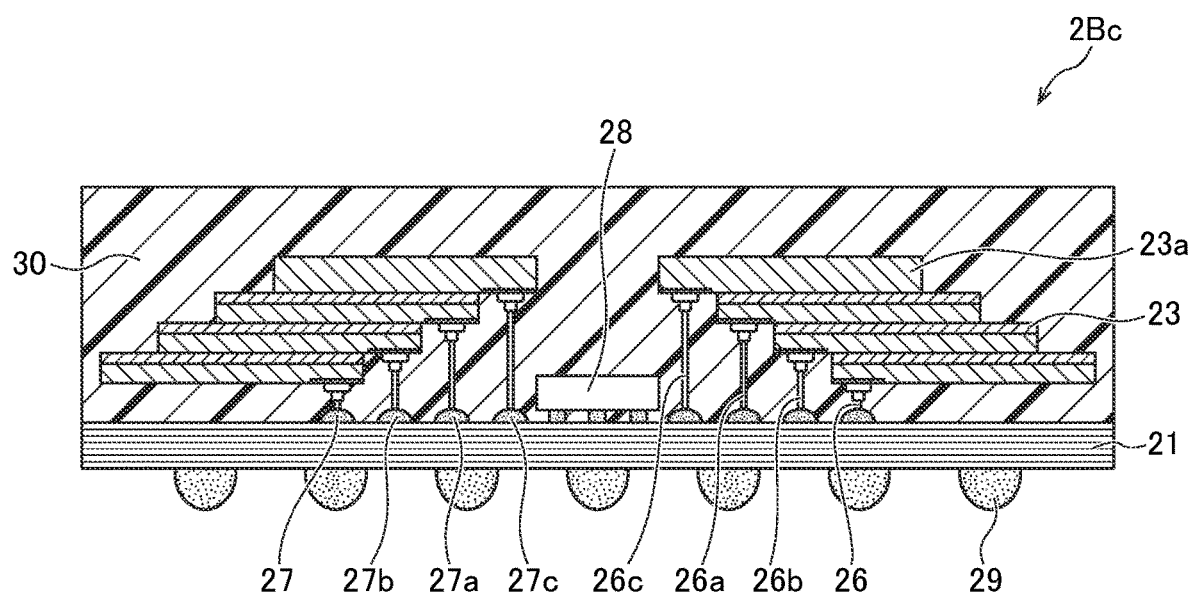
FIG. 12 is a cross-sectional view illustrating a third modification of the semiconductor device in the third embodiment.

The spacer 22 included in the semiconductor device 2B described above with reference to FIG. 9 is an optional constituent component. No spacer 22 may be provided as in the semiconductor device 2B illustrated in FIG. 10a. The support body 24 included in the semiconductor device 2B described above with reference to FIG. 9 is an optional constituent component. No support body 24 may be provided as in the semiconductor device 2B illustrated in FIG. 11b. When no support body 24 is provided, a first semiconductor chip 23a disposed farthest from the wiring substrate 21 is formed thicker than the other first semiconductor chips 23. No spacer 22 nor support body 24 may be provided as in semiconductor device 2Bc illustrated in FIG. 12. In this case as well, the first semiconductor chip 23a disposed farthest from the wiring substrate 21 is formed thicker than the other first semiconductor chips 23.

Figure 13:
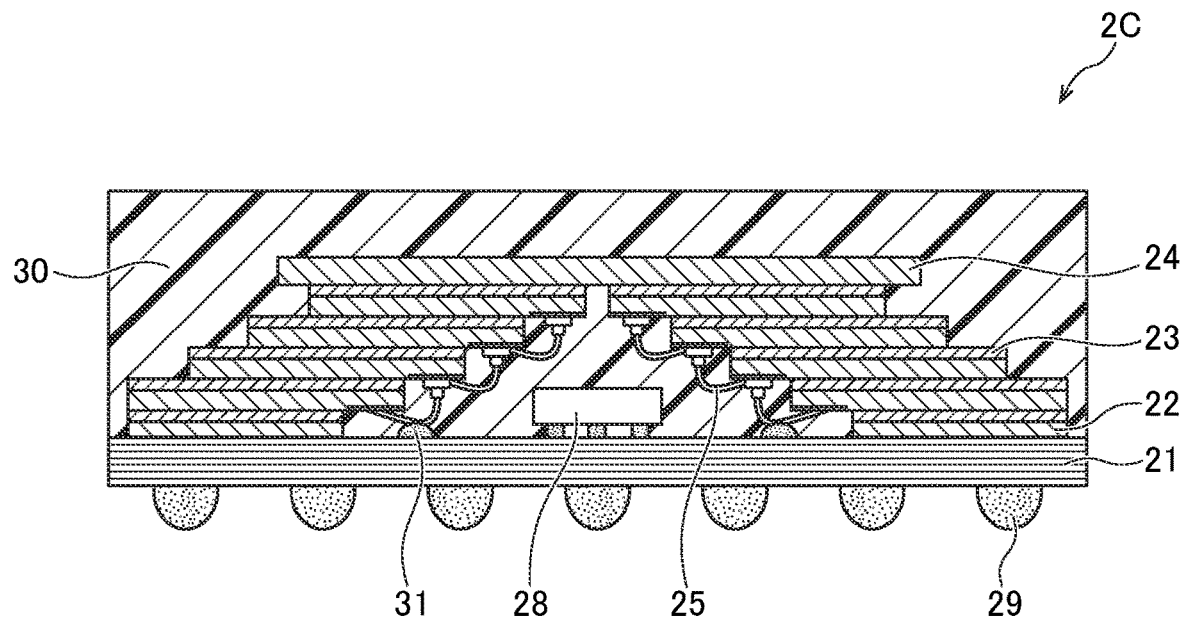
FIG. 13 is a cross-sectional view illustrating a semiconductor device in a fourth embodiment.

A semiconductor device 2C in a fourth embodiment will be described below with reference to FIG. 13. FIG. 13 is a cross-sectional view of the semiconductor device 2C. As illustrated in FIG. 13, the semiconductor device 2C includes a wiring substrate 21, a spacer 22, a first semiconductor chip 23, a support body 24, a loop wire 25, a metal bump 31, a second semiconductor chip 28, a metal ball 29, and a molding resin layer 30.

The first semiconductor chip 23 is provided on the wiring substrate 21. The first semiconductor chip 23 is, for example, a memory chip of a NAND flash memory. A plurality of the first semiconductor chips 23 are stacked. In the example illustrated in FIG. 13, eight first semiconductor chips 23 are divided into two sets and four first semiconductor chips 23 are stacked in each set, but the total number of first semiconductor chips 23, the number of sets, and the number of stacked first semiconductor chips 23 are not limited thereto. The first semiconductor chips 23 are stacked in a shifted manner such that part of each first semiconductor chip 23 faces the wiring substrate 21.

The second semiconductor chip 28 is flip-chip mounted on the wiring substrate 21. The second semiconductor chip 28 is, for example, a semiconductor chip on which an any LSI is mounted. The second semiconductor chip 28 is mounted on the wiring substrate 21 through a metal bump.

The first semiconductor chips 23 divided in two sets and mounted are disposed in a shifted manner such that the first semiconductor chips 23 in each set are sequentially positioned closer to the second semiconductor chip 28. The first semiconductor chip 23 disposed closest to the wiring substrate 21 is disposed farthest from the second semiconductor chip 28. The other first semiconductor chips 23 are disposed on the first semiconductor chip 23 disposed closest to the wiring substrate 21, in a shifted manner such that the first semiconductor chips 23 are sequentially positioned closer to the second semiconductor chip 28. The first semiconductor chip 23 disposed farthest from the wiring substrate 21 is disposed closest to the second semiconductor chip 28.

A die attach film (DAF) is provided between the stacked first semiconductor chips 23. The stacked first semiconductor chips 23 are electrically connected to each other through the loop wire 25. The metal bump 31 is provided on the wiring substrate 21. The metal bump 31 is electrically connected to the loop wire 25 connecting the first semiconductor chip 23 disposed closest to the wiring substrate 21 to the first semiconductor chip 23 stacked thereon. The loop wire 25 is connected to the metal bump 31 at a middle part of a loop.

The spacer 22 is provided between the first semiconductor chip 23 disposed closest to the wiring substrate 21 and the wiring substrate 21. A die attach film (DAF) is provided between the spacer 22 and the first semiconductor chip 23.

The support body 24 is provided on the first semiconductor chip 23 disposed farthest from the wiring substrate 21. A die attach film (DAF) is provided between the support body 24 and the first semiconductor chip 23.

The molding resin layer 30 is provided on the wiring substrate 21. The molding resin layer 30 covers the spacer 22, the first semiconductor chips 23, the support body 24, the loop wire 25, and the metal bump 31.

The metal ball 29 is provided on a surface on a side opposite a surface of the wiring substrate 21 on which the first semiconductor chips 23 are mounted.

Figure 14:
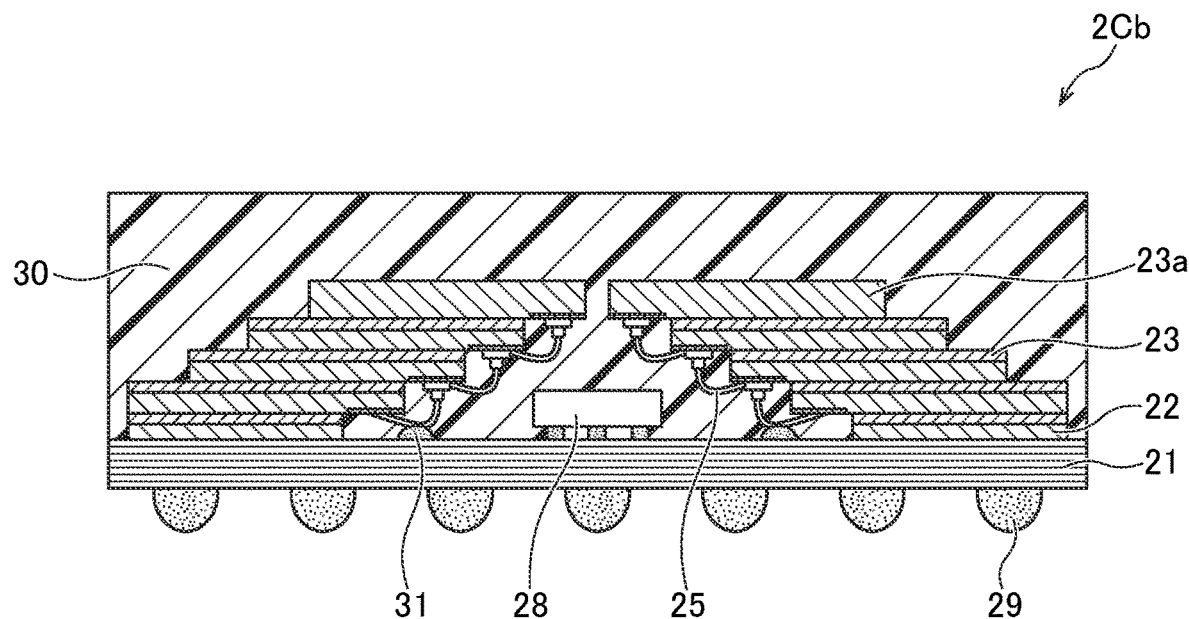
FIG. 14 is a cross-sectional view illustrating a modification of the semiconductor device in the fourth embodiment.

The support body 24 included in the semiconductor device 2C described above with reference to FIG. 13 is an optional constituent component. No support body 24 may be provided as in the semiconductor device 2C illustrated in FIG. 14b. When no support body 24 is provided, a first semiconductor chip 23a disposed farthest from the wiring substrate 21 is formed thicker than the other first semiconductor chips 23.

Figure 15:
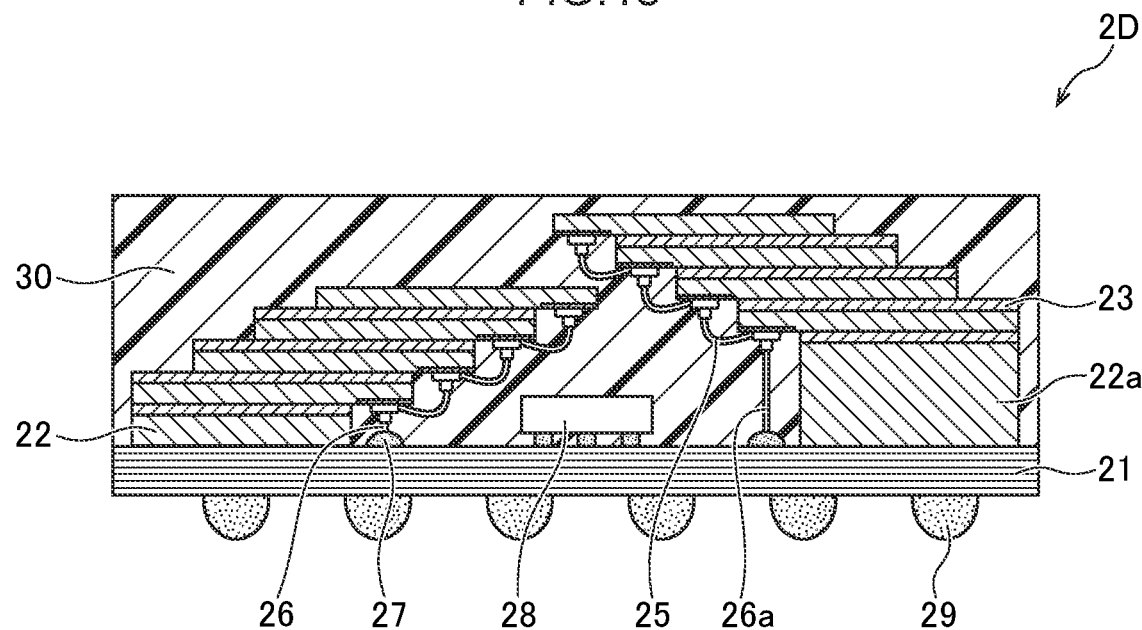
FIG. 15 is a cross-sectional view illustrating a semiconductor device in a fifth embodiment.

In the above-described embodiment, the example in which the first semiconductor chips 23 are disposed line symmetric is described, but the disposition aspect of the first semiconductor chips 23 is not limited thereto. A semiconductor device 2D in a fifth embodiment will be described below with reference to FIG. 15. FIG. 15 is a cross-sectional view of the semiconductor device 2D. As illustrated in FIG. 15, the semiconductor device 2D includes a wiring substrate 21, spacers 22 and 22a, a first semiconductor chip 23, a loop wire 25, vertical wires 26 and 26a, a metal bump 27, a second semiconductor chip 28, a metal ball 29, and a molding resin layer 30.

The first semiconductor chip 23 is provided on the wiring substrate 21. The first semiconductor chip 23 is, for example, a memory chip of a NAND flash memory. A plurality of the first semiconductor chips 23 are stacked. In the example illustrated in FIG. 15, eight first semiconductor chips 23 are divided into two sets and four first semiconductor chips 23 are stacked in each set, but the total number of first semiconductor chips 23, the number of sets, and the number of stacked first semiconductor chips 23 are not limited thereto. The first semiconductor chips 23 are stacked in a shifted manner such that part of each first semiconductor chip 23 faces the wiring substrate 21.

The second semiconductor chip 28 is flip-chip mounted on the wiring substrate 21. The second semiconductor chip 28 is, for example, a semiconductor chip on which an any LSI is mounted. The second semiconductor chip 28 is mounted on the wiring substrate 21 through a metal bump.

The first semiconductor chips 23 divided in two sets and mounted are disposed in a shifted manner such that the first semiconductor chips 23 in each set are sequentially positioned closer to the second semiconductor chip 28. The first semiconductor chip 23 disposed closest to the wiring substrate 21 is disposed farthest from the second semiconductor chip 28. The other first semiconductor chips 23 are disposed on the first semiconductor chip 23 disposed closest to the wiring substrate 21, in a shifted manner such that the first semiconductor chips 23 are sequentially positioned closer to the second semiconductor chip 28. The first semiconductor chip 23 disposed farthest from the wiring substrate 21 is disposed closest to the second semiconductor chip 28.

A die attach film (DAF) is provided between the stacked first semiconductor chips 23. The stacked second semiconductor chips 28 are electrically connected to each other through the loop wire 25. The metal bump 27 is provided on the wiring substrate 21. The first semiconductor chip 23 disposed closest to the wiring substrate 21 in each set is electrically connected to the metal bump 27 through the vertical wire 26 or 26a.

The spacers 22 and 22a are each provided between the first semiconductor chip 23 disposed closest to the wiring substrate 21 and the wiring substrate 21. A die attach film (DAF) is provided between each of the spacers 22 and 22a and the first semiconductor chip 23. The spacer 22a is thicker than the spacer 22. Although not illustrated, a bonding layer is provided between the wiring substrate 21 and each of the spacers 22 and 22a. The first semiconductor chip 23 disposed on the spacer 22a is connected to the metal bump 27 through the vertical wire 26a. The vertical wire 26a is longer than the vertical wire 26.

Since the spacer 22a is thicker than the spacer 22, the first semiconductor chip 23 stacked on the spacer 22 and the first semiconductor chip 23 stacked on the spacer 22a are disposed in a partially overlapping manner. In the example illustrated in FIG. 15, the first semiconductor chips 23 disposed farthest from the wiring substrate 21 are disposed in an overlapping manner over the second semiconductor chip 28.

The molding resin layer 30 is provided on the wiring substrate 21. The molding resin layer 30 covers the spacer 22, the first semiconductor chips 23, the loop wire 25, the vertical wires 26 and 26a, and the metal bump 27.

The metal ball 29 is provided on a surface on a side opposite a surface of the wiring substrate 21 on which the first semiconductor chips 23 are mounted.

Figure 16:
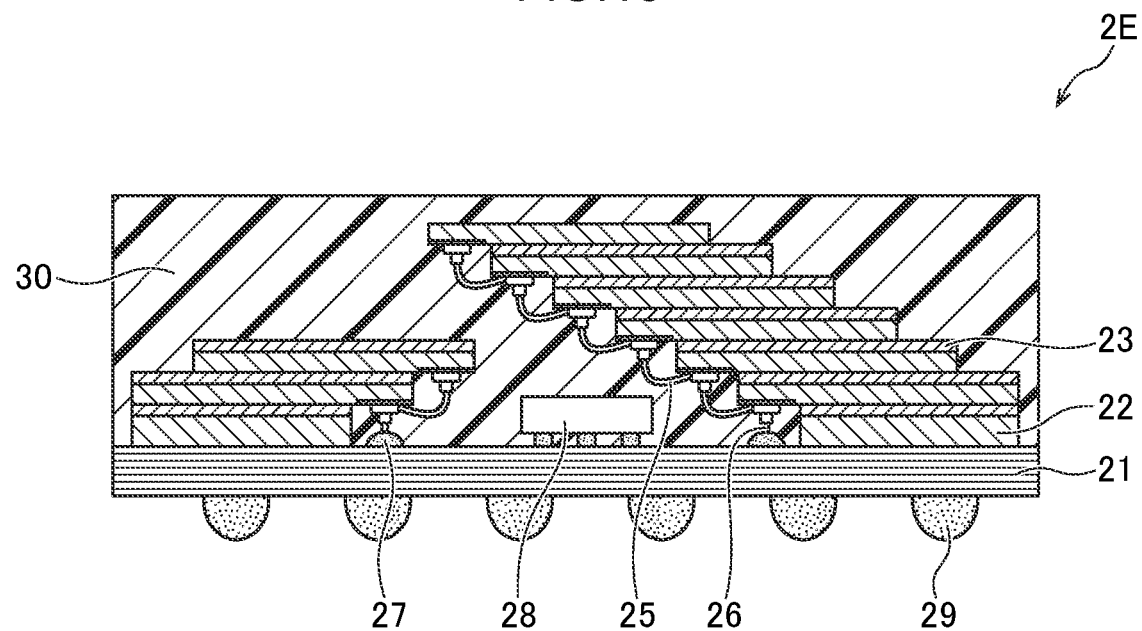
FIG. 16 is a cross-sectional view illustrating a semiconductor device in a sixth embodiment.

A semiconductor device 2E in a sixth embodiment will be described below with reference to FIG. 16. FIG. 16 is a cross-sectional view of the semiconductor device 2E. As illustrated in FIG. 16, the semiconductor device 2E includes a wiring substrate 21, a spacer 22, a first semiconductor chip 23, a loop wire 25, a vertical wire 26, a metal bump 27, a second semiconductor chip 28, a metal ball 29, and a molding resin layer 30.

The first semiconductor chip 23 is provided on the wiring substrate 21. The first semiconductor chip 23 is, for example, a memory chip of a NAND flash memory. A plurality of the first semiconductor chips 23 are stacked. In the example illustrated in FIG. 16, eight first semiconductor chips 23 are divided into two sets, two first semiconductor chips 23 are stacked in one of the sets, and six first semiconductor chips 23 are stacked in the other set. The first semiconductor chips 23 are stacked in a shifted manner such that part of each first semiconductor chip 23 faces the wiring substrate 21.

The second semiconductor chip 28 is flip-chip mounted on the wiring substrate 21. The second semiconductor chip 28 is, for example, a semiconductor chip on which an any LSI is mounted. The second semiconductor chip 28 is mounted on the wiring substrate 21 through a metal bump.

The first semiconductor chips 23 divided in two sets and mounted are disposed in a shifted manner such that the first semiconductor chips 23 in each set are sequentially positioned closer to the second semiconductor chip 28. The first semiconductor chip 23 disposed closest to the wiring substrate 21 is disposed farthest from the second semiconductor chip 28. The other first semiconductor chips 23 are disposed on the first semiconductor chip 23 disposed closest to the wiring substrate 21, in a shifted manner such that the first semiconductor chips 23 are sequentially positioned closer to the second semiconductor chip 28. The first semiconductor chip 23 disposed farthest from the wiring substrate 21 is disposed closest to the second semiconductor chip 28.

A die attach film (DAF) is provided between the stacked first semiconductor chips 23. The stacked second semiconductor chips 28 are electrically connected to each other through the loop wire 25. The metal bump 27 is provided on the wiring substrate 21. The first semiconductor chip 23 disposed closest to the wiring substrate 21 is electrically connected to the metal bump 27 through the vertical wire 26.

The spacer 22 is provided between the first semiconductor chip 23 disposed closest to the wiring substrate 21 and the wiring substrate 21. A die attach film (DAF) is provided between the spacer 22 and the first semiconductor chip 23. Although not illustrated, a bonding layer is provided between the wiring substrate 21 and the spacer 22. The bonding layer is a resin different from that of the molding resin layer 30 and corresponds to a "third resin" of the present embodiment.

Since the number of stacked first semiconductor chips 23 is different between the right and left sets, the two stacked first semiconductor chips 23 and part of the six stacked first semiconductor chips 23 are disposed in an overlapping manner. In the example illustrated in FIG. 16, the first semiconductor chips 23 disposed farthest from the wiring substrate 21 are disposed in an overlapping manner over the second semiconductor chip 28.

The molding resin layer 30 is provided on the wiring substrate 21. The molding resin layer 30 covers the spacer 22, the first semiconductor chips 23, the loop wire 25, the vertical wires 26 and 26a, and the metal bump 27.

The metal ball 29 is provided on a surface on a side opposite a surface of the wiring substrate 21 on which the first semiconductor chips 23 are mounted.

Figure 17:
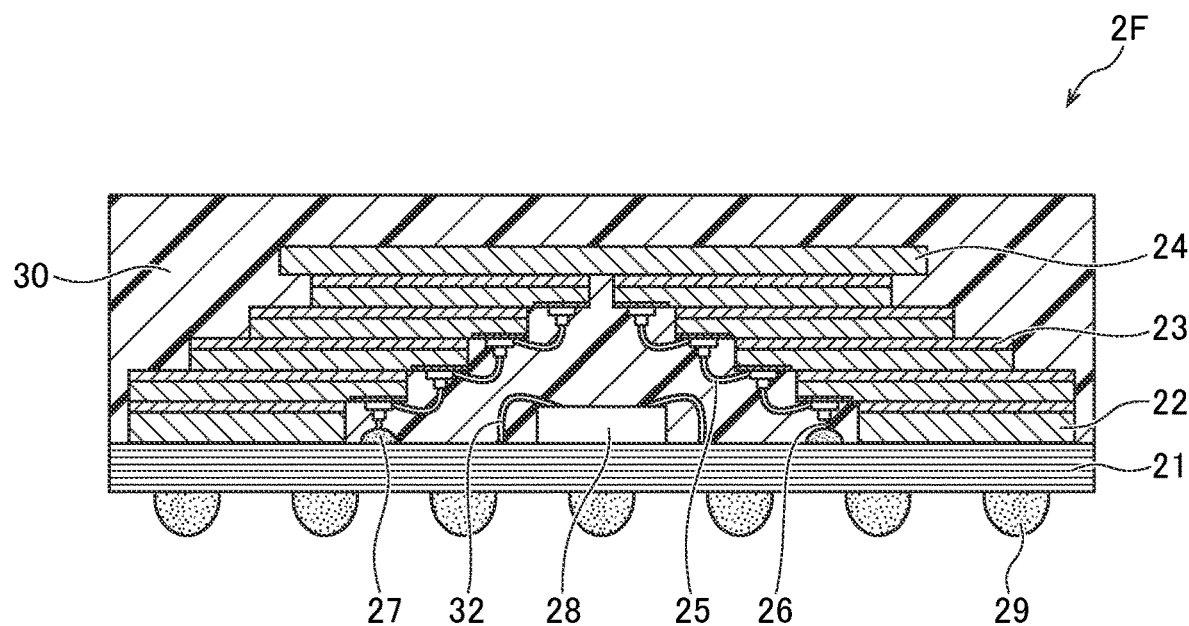
FIG. 17 is a cross-sectional view illustrating a semiconductor device in a seventh embodiment.

A semiconductor device 2F in seventh embodiment will be described below with reference to FIG. 17. FIG. 17 is a cross-sectional view of the semiconductor device 2F. As illustrated in FIG. 17, the semiconductor device 2F includes a wiring substrate 21, a spacer 22, a first semiconductor chip 23, a support body 24, a loop wire 25, a vertical wire 26, a metal bump 27, a second semiconductor chip 28, a metal ball 29, and a molding resin layer 30.

The semiconductor device 2F is different from the semiconductor device 2 in the first embodiment in the mounting aspect of the second semiconductor chip 28.

The second semiconductor chip 28 is mounted on the wiring substrate 21 by wire bonding. The second semiconductor chip 28 is, for example, a semiconductor chip on which an any LSI is mounted. The second semiconductor chip 28 is mounted on the wiring substrate 21 through wires 32.

Figure 18:
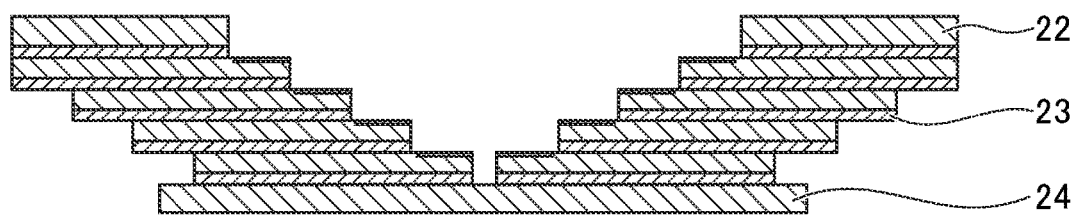
FIG. 18 is a cross-sectional view for description of a method of manufacturing the semiconductor device in the first embodiment.

Subsequently, a method of manufacturing the semiconductor device 2 will be described below with reference to FIGS. 18 to 23. As illustrated in FIG. 18, a support body 24, first semiconductor chips 23, and spacers 22 are prepared. First semiconductor chips 23 are each disposed on the support body 24 through a die attach film (DAF). In the present embodiment, a pair of first semiconductor chips 23 are disposed. Subsequently, a next first semiconductor chip 23 is disposed on each disposed first semiconductor chip 23 through a die attach film (DAF). The newly disposed first semiconductor chip 23 is disposed on the support body 24 side with a shift outward from the first semiconductor chip 23. Similarly, a next first semiconductor chip 23 is disposed on the first semiconductor chip 23 through a die attach film (DAF) and then another subsequently first semiconductor chip 23 is disposed thereon. Lastly, the spacers 22 are disposed on the topmost first semiconductor chips 23 through a die attach film (DAF), and accordingly, a stack body is formed.

Figure 19:
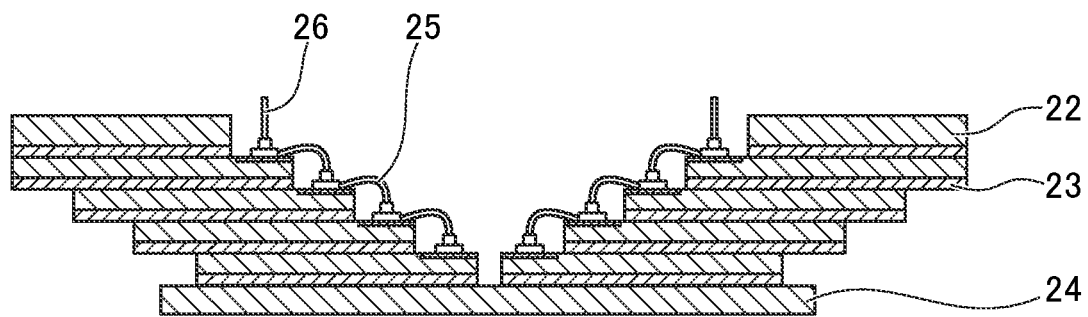
FIG. 19 is a cross-sectional view for description of the method of manufacturing the semiconductor device in the first embodiment.

As illustrated in FIG. 19, the stacked first semiconductor chips 23 are electrically connected to each other through a loop wire 25. Each topmost first semiconductor chip 23 is provided with a vertical wire 26.

Figure 20:
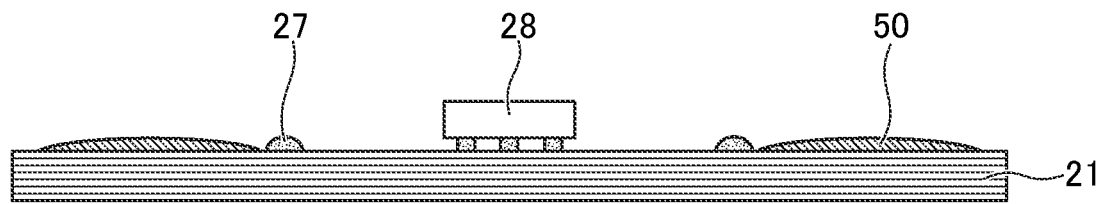
FIG. 20 is a cross-sectional view for description of the method of manufacturing the semiconductor device in the first embodiment.

As illustrated in FIG. 20, metal bumps 27 and a second semiconductor chip 28 are provided on a wiring substrate 21. The second semiconductor chip 28 is flip-chip mounted on the wiring substrate 21. The second semiconductor chip 28 is mounted on the wiring substrate 21 through metal bumps. A bonding agent 50 is applied at positions where the stack body illustrated in FIG. 19 is to be disposed on the wiring substrate 21.

Figure 21:
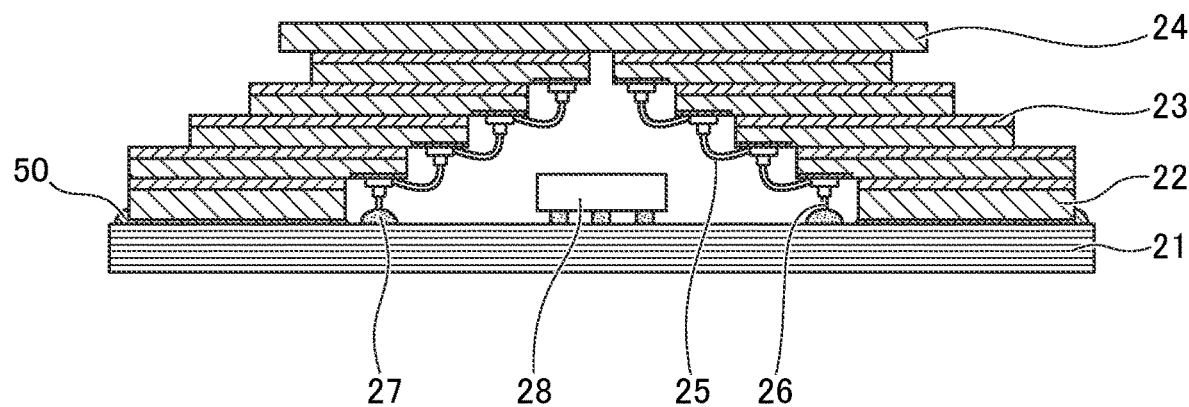
FIG. 21 is a cross-sectional view for description of the method of manufacturing the semiconductor device in the first embodiment.

As illustrated in FIG. 21, the stack body illustrated in FIG. 19 is vertically inverted and disposed on the prepared wiring substrate 21 in FIG. 20. The disposition involves such positioning that the vertical wires 26 join the metal bumps 27. The wiring substrate 21 and each spacer 22 are bonded to each other through the bonding agent 50.

Figure 22:
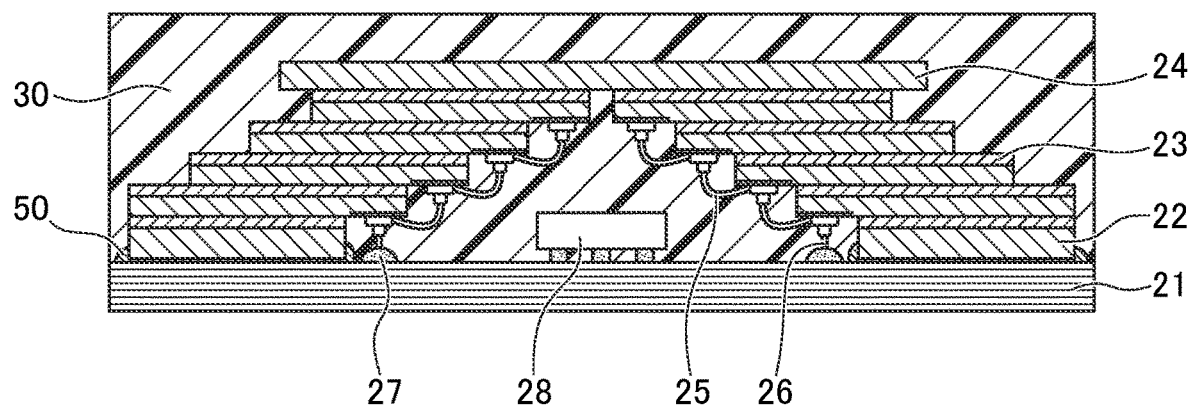
FIG. 22 is a cross-sectional view for description of the method of manufacturing the semiconductor device in the first embodiment.

As illustrated in FIG. 22, a molding resin layer 30 is formed to cover the spacers 22, the first semiconductor chips 23, the support body 24, the loop wires 25, the vertical wires 26, and the metal bumps 27.

Figure 23:
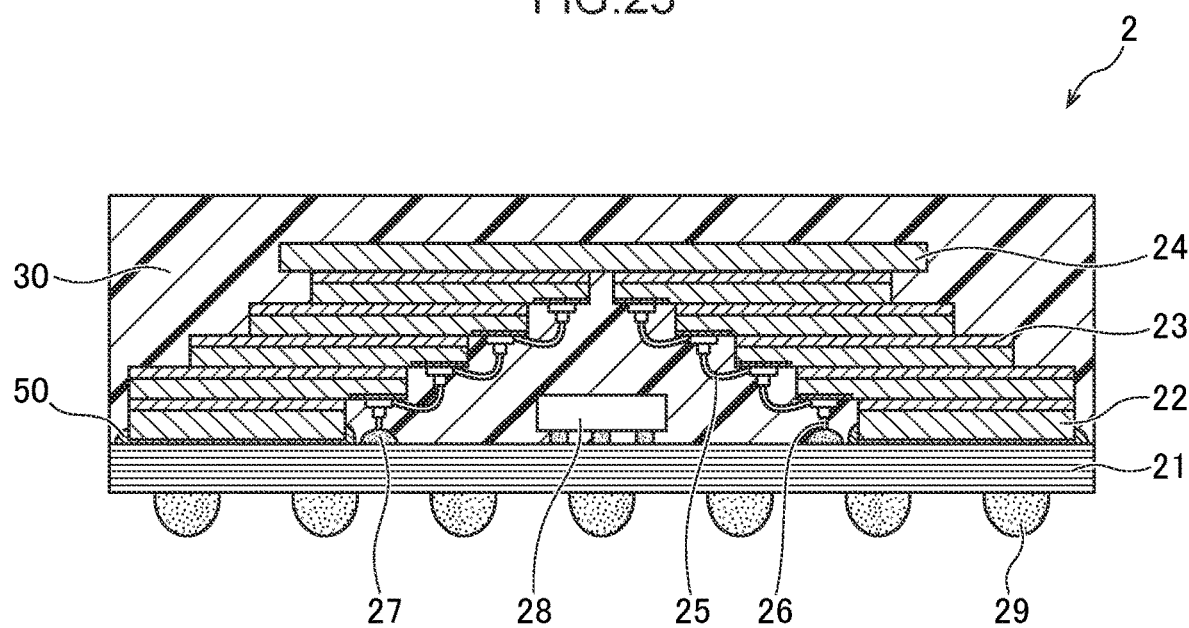
FIG. 23 is a cross-sectional view for description of the method of manufacturing the semiconductor device in the first embodiment.

As illustrated in FIG. 23, metal balls 29 are provided on a surface on a side opposite a surface of the wiring substrate 21 on which the first semiconductor chips 23 are mounted, and accordingly, the semiconductor device 2 is formed.

Another method of manufacturing the semiconductor device 2 will be described below with reference to FIGS. 24 to 28. Formation of a stack body is partially the same as in the description with reference to FIGS. 18 and 19. Difference is such that the spacers 22 are disposed in FIGS. 18 and 19, while the spacers 22 are disposed on the wiring substrate 21 side in the other manufacturing method described next.

Figure 24:
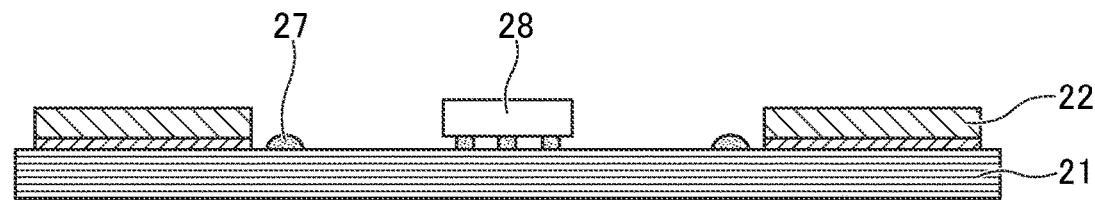
FIG. 24 is a cross-sectional view for description of the method of manufacturing the semiconductor device in the first embodiment.
Figure 25:
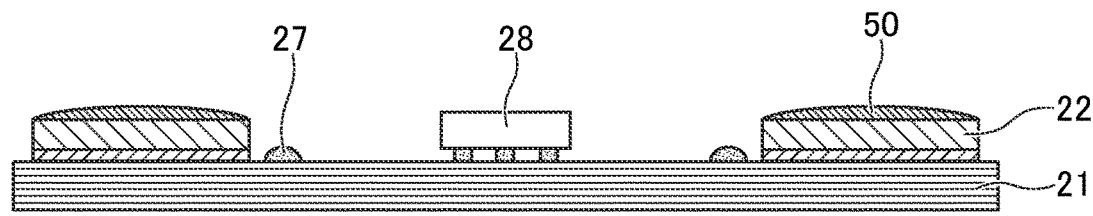
FIG. 25 is a cross-sectional view for description of the method of manufacturing the semiconductor device in the first embodiment.

As illustrated in FIG. 24, metal bumps 27 and a second semiconductor chip 28 are provided on a wiring substrate 21. The second semiconductor chip 28 is flip-chip mounted on the wiring substrate 21. The second semiconductor chip 28 is mounted on the wiring substrate 21 through metal bumps. Spacers 22 are provided through a die attach film (DAF) at positions where the stack body is to be disposed on the wiring substrate 21. As illustrated in FIG. 25, a bonding agent 50 is applied on the spacers 22.

Figure 26:
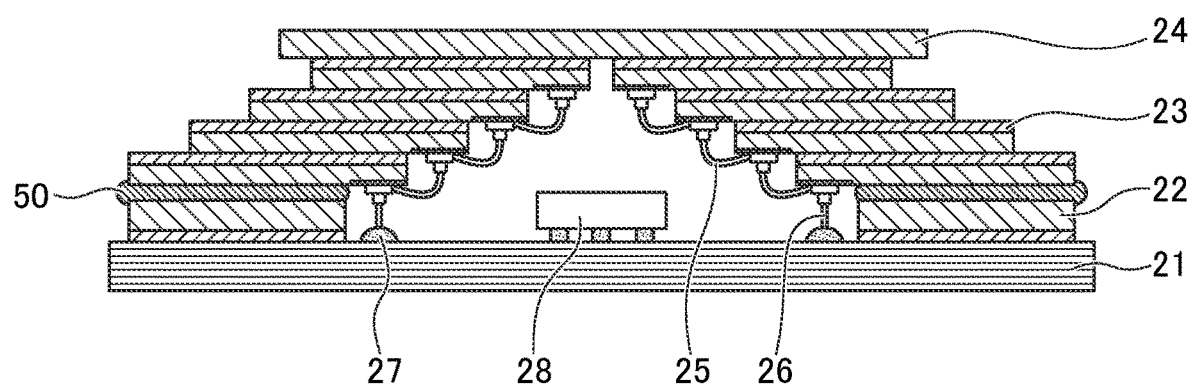
FIG. 26 is a cross-sectional view for description of the method of manufacturing the semiconductor device in the first embodiment.

As illustrated in FIG. 26, the stack body illustrated in FIG. 19 except for the spacers 22 is vertically inverted and disposed on the prepared wiring substrate 21 in FIG. 25. The disposition involves such positioning that the vertical wires 26 join the metal bumps 27. The spacers 22 are bonded to the first semiconductor chips 23 through the bonding agent 50.

Figure 27:
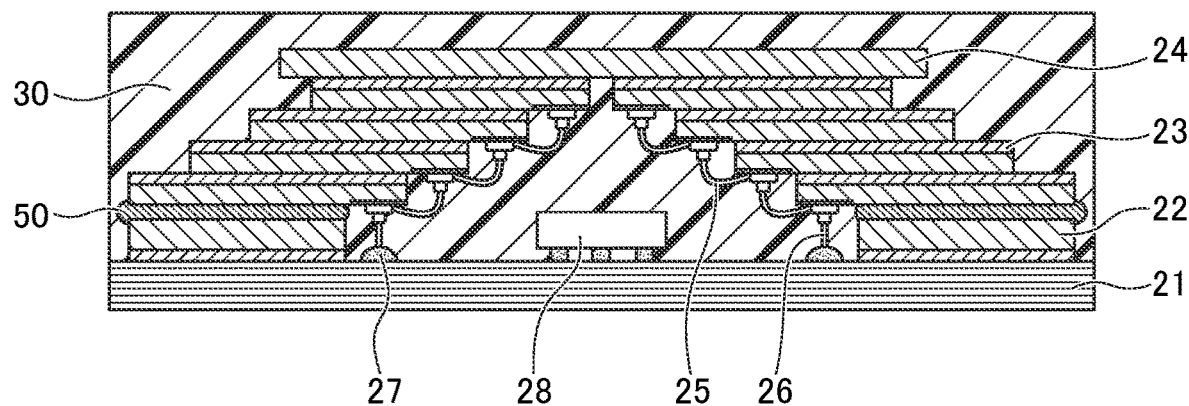
FIG. 27 is a cross-sectional view for description of the method of manufacturing the semiconductor device in the first embodiment.

As illustrated in FIG. 27, a molding resin layer 30 is formed to cover the spacers 22, the first semiconductor chips 23, the support body 24, the loop wires 25, the vertical wires 26, and the metal bumps 27.

Figure 28:
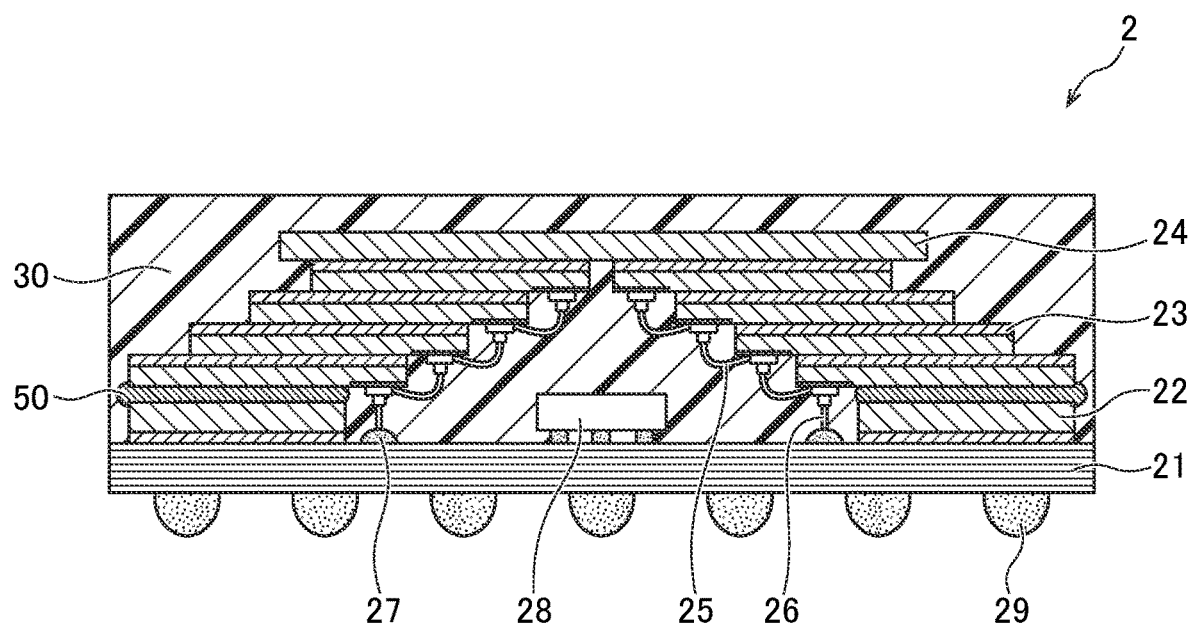
FIG. 28 is a cross-sectional view for description of the method of manufacturing the semiconductor device in the first embodiment.

As illustrated in FIG. 28, metal balls 29 are provided on a surface on a side opposite a surface of the wiring substrate 21 on which the first semiconductor chips 23 are mounted, and accordingly, the semiconductor device 2 is formed.

Subsequently, a method of manufacturing the semiconductor device 2a will be described below with reference to FIGS. 29 to 33. Formation of a stack body is partially the same as in the description with reference to FIGS. 18 and 19. Difference is such that the spacers 22 in FIGS. 18 and 19 are not disposed since the semiconductor device 2a includes no spacers 22.

Figure 29:
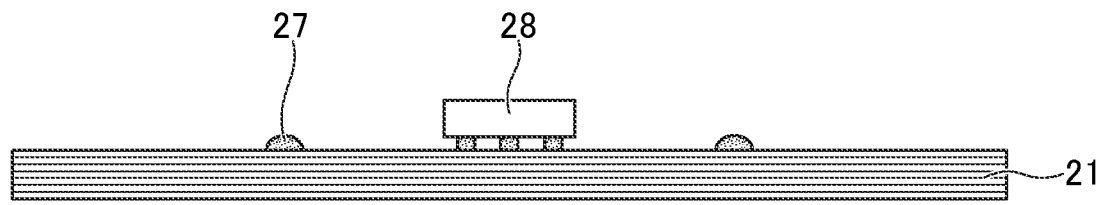
FIG. 29 is a cross-sectional view for description of a method of manufacturing the semiconductor device in the first modification of the first embodiment.

As illustrated in FIG. 29, metal bumps 27 and a second semiconductor chip 28 are provided on a wiring substrate 21. The second semiconductor chip 28 is flip-chip mounted on the wiring substrate 21. The second semiconductor chip 28 is mounted on the wiring substrate 21 through metal bumps.

Figure 30:
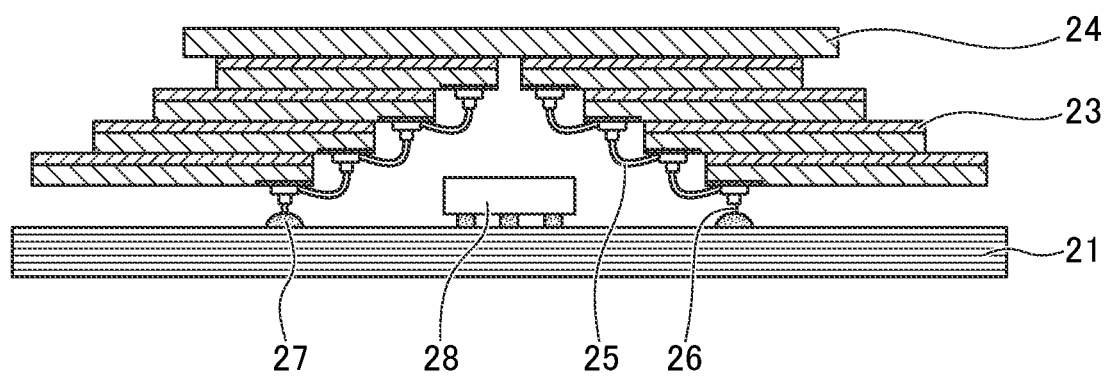
FIG. 30 is a cross-sectional view for description of the method of manufacturing the semiconductor device in the first modification of the first embodiment.

As illustrated in FIG. 30, the stack body illustrated in FIG. 19 except for the spacers 22 is vertically inverted and disposed on the prepared wiring substrate 21 in FIG. 29. The disposition involves such positioning that the vertical wires 26 join the metal bumps 27. The wiring substrate 21 and the stack body are joined to each other by thermal press bonding.

Figure 31:
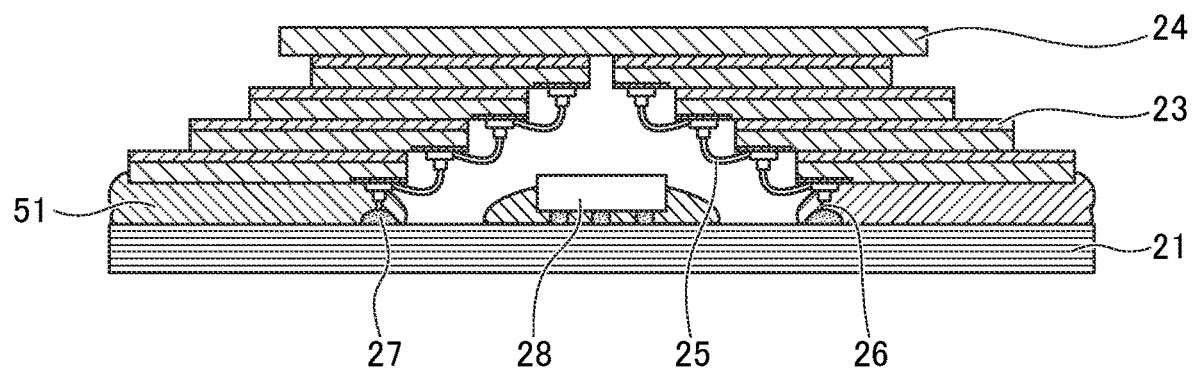
FIG. 31 is a cross-sectional view for description of the method of manufacturing the semiconductor device in the first modification of the first embodiment.

As illustrated in FIG. 31, gaps between the wiring substrate 21 and the first semiconductor chips 23 of the stack body and the second semiconductor chip 28 are filled with an underfill material (UF) 51. The underfill material 51 is a resin different from the molding resin layer 30 and corresponds to a "second resin" of the present embodiment.

Figure 32:
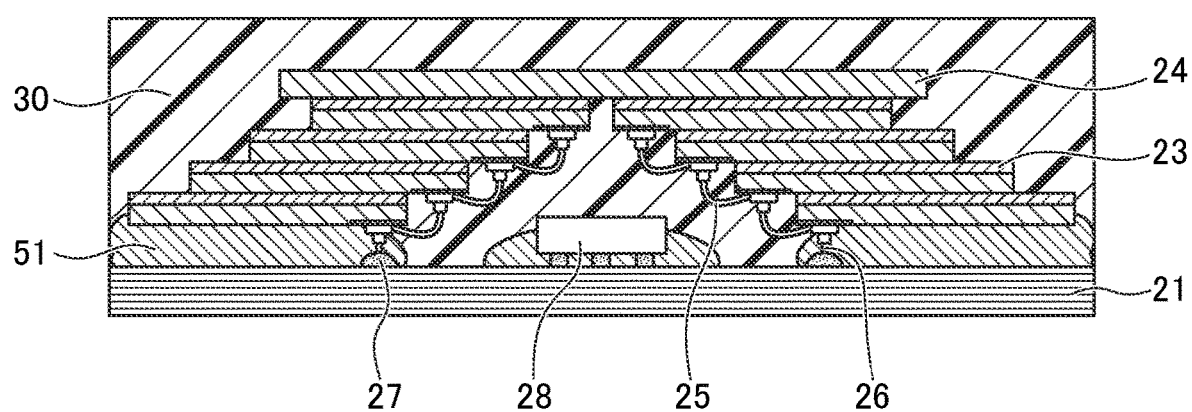
FIG. 32 is a cross-sectional view for description of the method of manufacturing the semiconductor device in the first modification of the first embodiment.

As illustrated in FIG. 32, a molding resin layer 30 is formed to cover the first semiconductor chips 23, the support body 24, the loop wires 25, the vertical wires 26, and the metal bumps 27.

Figure 33:
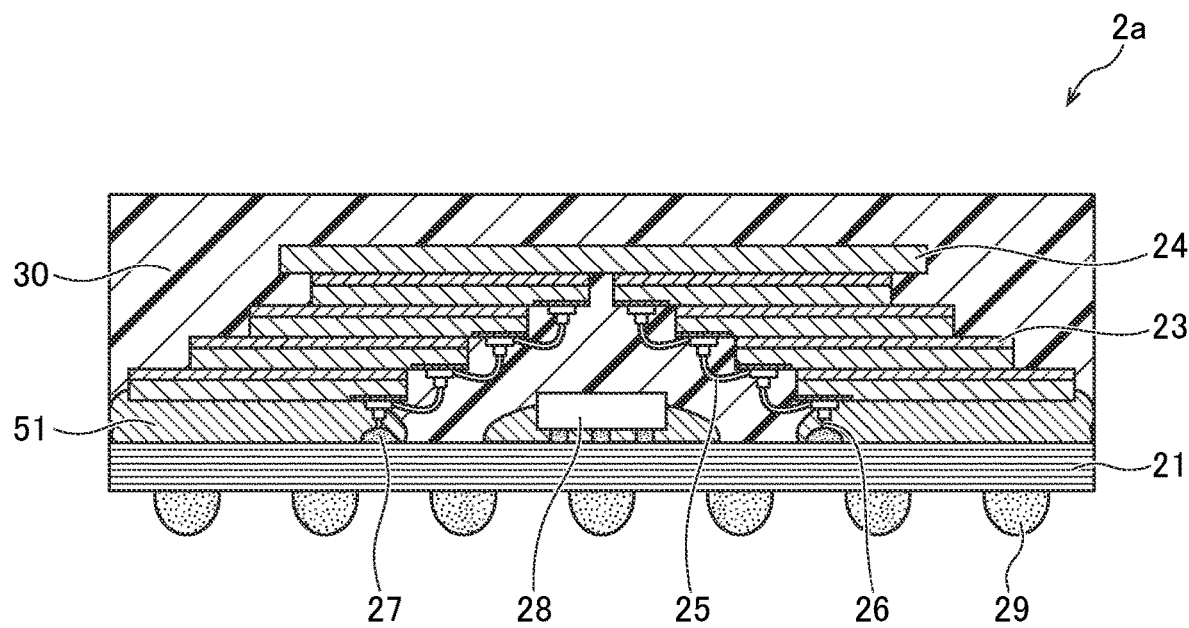
FIG. 33 is a cross-sectional view for description of the method of manufacturing the semiconductor device in the first modification of the first embodiment.

As illustrated in FIG. 33, metal balls 29 are provided on a surface on a side opposite a surface of the wiring substrate 21 on which the first semiconductor chips 23 are mounted, and accordingly, the semiconductor device 2a is formed.

Another method of manufacturing the semiconductor device 2a will be described below with reference to FIGS. 34 to 37. Formation of a stack body is partially the same as in the description with reference to FIGS. 18 and 19. Difference is such that the spacers 22 in FIGS. 18 and 19 are not disposed since the semiconductor device 2a includes no spacers 22.

Figure 34:
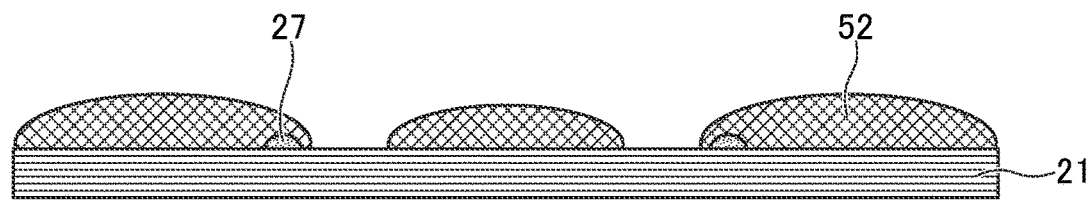
FIG. 34 is a cross-sectional view for description of the method of manufacturing the semiconductor device in the first modification of the first embodiment.

As illustrated in FIG. 34, metal bumps 27 are provided on the wiring substrate 21. Non-conductive paste (NCP) 52 is applied at positions where the stack body and a second semiconductor chip 28 is to be disposed on the wiring substrate 21. The non-conductive paste (NCP) is thermosetting paste made of epoxy resin or the like.

Figure 35:
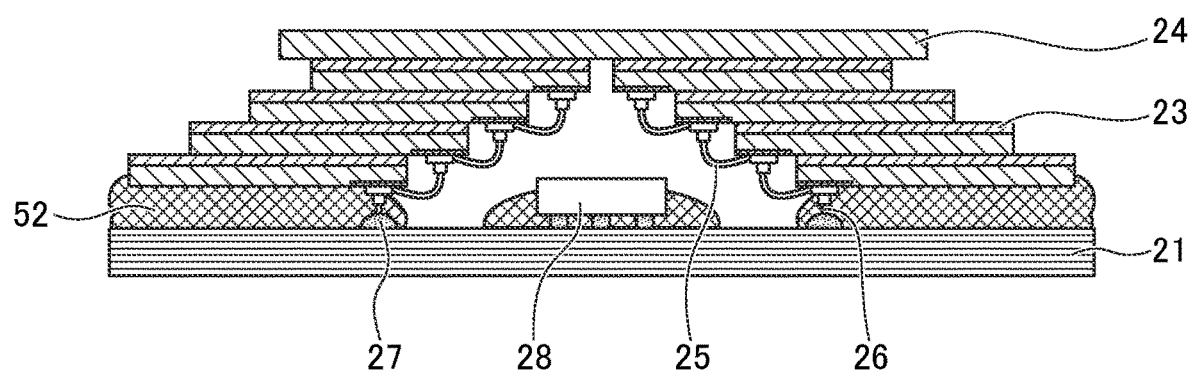
FIG. 35 is a cross-sectional view for description of the method of manufacturing the semiconductor device in the first modification of the first embodiment.

As illustrated in FIG. 35, the stack body illustrated in FIG. 19 except for the spacers 22 is vertically inverted and disposed on the prepared wiring substrate 21 in FIG. 34. The disposition involves such positioning that the vertical wires 26 join the metal bumps 27. The wiring substrate 21 and the stack body are joined to each other by thermal press bonding.

Figure 36:
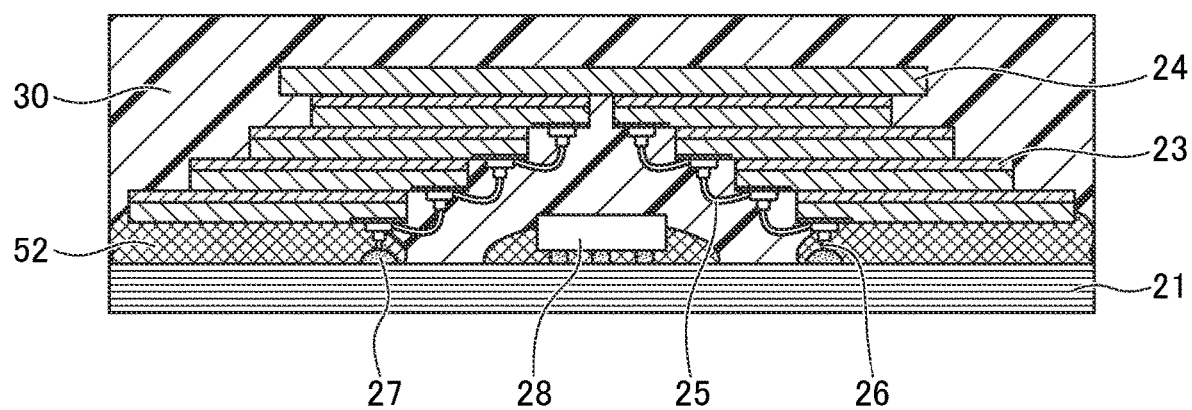
FIG. 36 is a cross-sectional view for description of the method of manufacturing the semiconductor device in the first modification of the first embodiment.

As illustrated in FIG. 36, a molding resin layer 30 is formed to cover the first semiconductor chips 23, the support body 24, the loop wires 25, the vertical wires 26, and the metal bumps 27.

Figure 37:
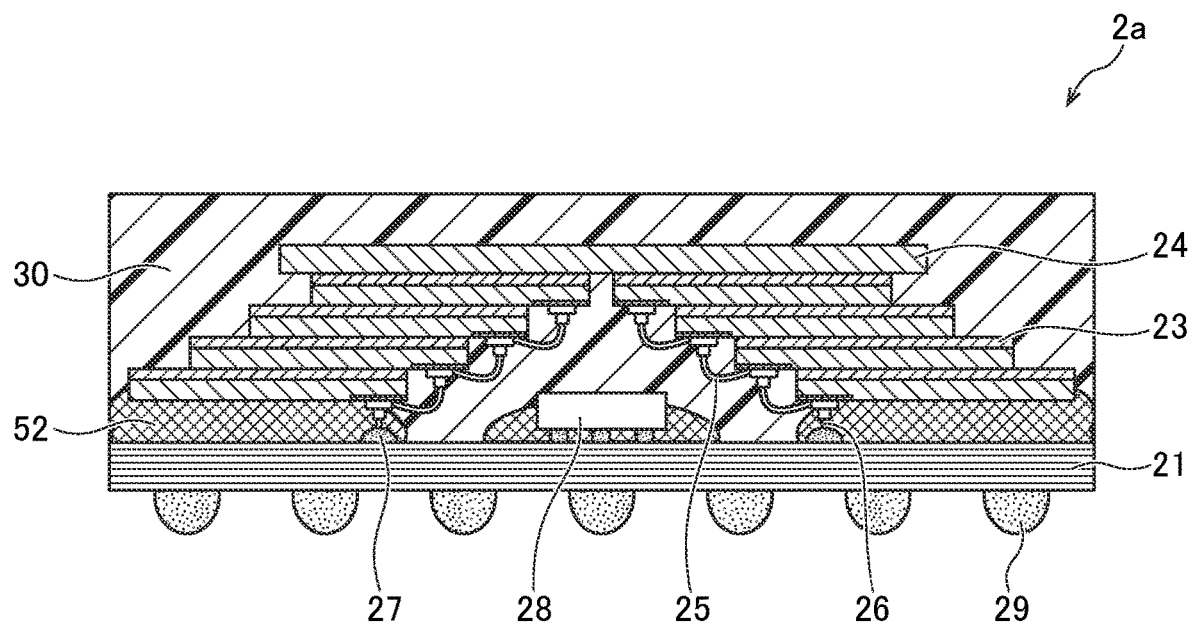
FIG. 37 is a cross-sectional view for description of the method of manufacturing the semiconductor device in the first modification of the first embodiment.

As illustrated in FIG. 37, metal balls 29 are provided on a surface on a side opposite a surface of the wiring substrate 21 on which the first semiconductor chips 23 are mounted, and accordingly, the semiconductor device 2a is formed.

The present embodiments are described above with reference to specific examples. However, the present disclosure is not limited to these specific examples. Those obtained by changing designing of the specific examples as appropriate by the skilled person in the art are included in the scope of the present disclosure as long as they have features of the present disclosure. Each element included in each above-described specific example and, for example, the disposition, condition, and shape thereof are not limited to those exemplarily illustrated but may be changed as appropriate. Combination of elements included in the above-described specific examples may be changed as appropriate without technological inconsistency.

What is claimed is:

1. A semiconductor device comprising:
   a wiring substrate inside which a wiring layer is provided;
   a plurality of first semiconductor chips stacked in a shifted manner on the wiring substrate and each provided with a connection terminal on a surface facing the wiring substrate; and
   a second semiconductor chip having a function different from functions of the first semiconductor chips and provided on the wiring substrate on a side where the connection terminals are electrically connected to the wiring substrate, wherein
- a direction perpendicular to a stacking direction of the plurality of first semiconductor chips is defined as a first direction,
- each first semiconductor chip includes:
  - a first side positioned closer to the second semiconductor chip in the first direction; and
  - a second side positioned farther from the second semiconductor chip in the first direction,
- the connection terminal of each first semiconductor chip is located closer to the first side than the second side in the first direction, and
- the semiconductor device further comprises a plurality of wires electrically connecting the connection terminals of the first semiconductor chips to the wiring substrate.

2. The semiconductor device according to claim 1, wherein the first semiconductor chips are electrically connected to each other, and some of the connection terminals provided on the first semiconductor chips are electrically connected to the wiring substrate.

3. The semiconductor device according to claim 1, wherein the first semiconductor chips are divided in a plurality of sets and provided on the wiring substrate, and height of the first semiconductor chips thus stacked is different among the sets.

4. The semiconductor device according to claim 1, wherein a position where the first semiconductor chips are provided overlaps a position where the second semiconductor chip is provided.

5. The semiconductor device according to claim 1, wherein a first resin covering the first semiconductor chips and the second semiconductor chip on the wiring substrate is different from a second resin contacting the wiring substrate and the first semiconductor chips.

6. The semiconductor device according to claim 1, wherein a spacer is provided between the plurality of the first semiconductor chips and the wiring substrate.

7. The semiconductor device according to claim 6, wherein a first resin covering the first semiconductor chips and the second semiconductor chip on the wiring substrate is different from a third resin contacting the spacer and the first semiconductor chips.

8. The semiconductor device according to claim 1, wherein the plurality of first semiconductor chips thus stacked are shifted from each other such that the first semiconductor chips positioned farther from the wiring substrate in a stacking direction are positioned closer to the second semiconductor chip in a direction orthogonal to the stacking direction.

9. The semiconductor device according to claim 1, further comprising a support body, wherein the first semiconductor chips are sandwiched between the wiring substrate and the support body.

10. The semiconductor device according to claim 9, wherein the first semiconductor chips are divided in a plurality of sets and provided on the wiring substrate.

11. The semiconductor device according to claim 10, wherein the plurality of first semiconductor chips are sandwiched between the wiring substrate and the support body that is a single body.

* * * * *